United States Patent
Sakaguchi

(10) Patent No.: US 7,821,430 B2
(45) Date of Patent: Oct. 26, 2010

(54) ARITHMETIC DECODING APPARATUS

(75) Inventor: Hiroaki Sakaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 56 days.

(21) Appl. No.: 12/394,132

(22) Filed: Feb. 27, 2009

(65) Prior Publication Data

US 2009/0219183 A1    Sep. 3, 2009

(30) Foreign Application Priority Data

Feb. 29, 2008   (JP)   ............................. P2008-049022

(51) Int. Cl.
*H03M 7/30* (2006.01)
(52) U.S. Cl. ...................................... 341/107
(58) Field of Classification Search .................... 341/107
See application file for complete search history.

(56) References Cited

U.S. PATENT DOCUMENTS

| | | | | |
|---|---|---|---|---|
| 5,025,258 A | * | 6/1991 | Duttweiler | .................. 341/107 |
| 5,774,081 A | * | 6/1998 | Cheng et al. | ................. 341/107 |
| 6,864,813 B2 | * | 3/2005 | Horie | .......................... 341/107 |
| 7,262,722 B1 | * | 8/2007 | Jahanghir et al. | ........... 341/107 |
| 7,304,590 B2 | * | 12/2007 | Park | ............................. 341/107 |
| 2005/0088324 A1 | * | 4/2005 | Fuchigami et al. | .......... 341/107 |

* cited by examiner

*Primary Examiner*—Howard Williams
(74) *Attorney, Agent, or Firm*—Frommer Lawrence & Haug LLP; William S. Frommer

(57) ABSTRACT

Disclosed herein is an arithmetic decoding apparatus that decodes encoded data while updating first and second state variables based on first and second context variables. The first context variable represents a probability state. The second context variable represents a most probable symbol. The arithmetic decoding apparatus includes: a decoding information table that stores transitions of a range of the most probable symbol and a range of a least probable symbol within a range identified by the first context variable, and a number of a symbol for which the range of the most probable symbol becomes less than a specific value; a number-of-symbols determination section configured to determine the number of symbols in the encoded data that are to be decoded collectively; and an output section configured to decode and output a symbol corresponding to the number of symbols that are to be decoded collectively.

3 Claims, 35 Drawing Sheets

FIG. 24

| LENGTH PERMITTING COLLECTIVE DECODING | NUMBER OF TUPLES | PROPORTIONS | |
|---|---|---|---|
| 1 | 3429 | 20.9% | 79.1% |
| 2 | 2757 | 37.8% | 62.2% |
| 3 | 1611 | 47.6% | 52.4% |
| 4 | 1174 | 64.0% | 36.0% |
| 5 | 846 | | |
| 6 | 674 | | |
| 7 OR GREATER | 5893 | | |

FIG. 25

| LENGTH PERMITTING COLLECTIVE DECODING | NUMBER OF OCCURRENCES | PROPORTIONS | |
|---|---|---|---|
| 1 | 3779166 | 45.1% | 54.9% |
| 2 | 1058565 | 57.7% | 42.3% |
| 3 | 609099 | 64.9% | 35.1% |
| 4 | 430769 | 70.1% | 29.9% |
| 5 | 311237 | 73.8% | 26.2% |
| 6 | 244835 | 76.7% | 23.3% |
| 7 OR GREATER | 1954937 | | |

FIG.27

| pStateIdx | rangeTabLPS qCodIRangeIdx | | | |
|---|---|---|---|---|
| | =0 | =1 | =2 | =3 |
| 0 | 128 | 176 | 208 | 240 |
| 1 | 128 | 167 | 197 | 227 |
| 2 | 128 | 158 | 187 | 216 |
| 3 | 123 | 150 | 178 | 205 |
| 4 | 116 | 142 | 169 | 195 |
| 5 | 111 | 135 | 160 | 185 |
| 6 | 105 | 128 | 152 | 175 |
| 7 | 100 | 122 | 144 | 166 |
| 8 | 95 | 116 | 137 | 158 |
| 9 | 90 | 110 | 130 | 150 |
| 10 | 85 | 104 | 123 | 142 |
| 11 | 81 | 99 | 117 | 135 |
| 12 | 77 | 94 | 111 | 128 |
| 13 | 73 | 89 | 105 | 122 |
| 14 | 69 | 85 | 100 | 116 |
| 15 | 66 | 80 | 95 | 110 |
| 16 | 62 | 76 | 90 | 104 |
| 17 | 59 | 72 | 86 | 99 |
| 18 | 56 | 69 | 81 | 94 |
| 19 | 53 | 65 | 77 | 89 |
| 20 | 51 | 62 | 73 | 85 |
| 21 | 48 | 59 | 69 | 80 |
| 22 | 46 | 56 | 66 | 76 |
| 23 | 43 | 53 | 63 | 72 |
| 24 | 41 | 50 | 59 | 69 |
| 25 | 39 | 48 | 56 | 65 |
| 26 | 37 | 45 | 54 | 62 |
| 27 | 35 | 43 | 51 | 59 |
| 28 | 33 | 41 | 48 | 56 |
| 29 | 32 | 39 | 46 | 53 |
| 30 | 30 | 37 | 43 | 50 |
| 31 | 29 | 35 | 41 | 48 |
| 32 | 27 | 33 | 39 | 45 |
| 33 | 26 | 31 | 37 | 43 |
| 34 | 24 | 30 | 35 | 41 |
| 35 | 23 | 28 | 33 | 39 |
| 36 | 22 | 27 | 32 | 37 |
| 37 | 21 | 26 | 30 | 35 |
| 38 | 20 | 24 | 29 | 33 |
| 39 | 19 | 23 | 27 | 31 |
| 40 | 18 | 22 | 26 | 30 |
| 41 | 17 | 21 | 25 | 28 |
| 42 | 16 | 20 | 23 | 27 |
| 43 | 15 | 19 | 22 | 25 |
| 44 | 14 | 18 | 21 | 24 |
| 45 | 14 | 17 | 20 | 23 |
| 46 | 13 | 16 | 19 | 22 |
| 47 | 12 | 15 | 18 | 21 |
| 48 | 12 | 14 | 17 | 20 |
| 49 | 11 | 14 | 16 | 19 |
| 50 | 11 | 13 | 15 | 18 |
| 51 | 10 | 12 | 15 | 17 |
| 52 | 10 | 12 | 14 | 16 |
| 53 | 9 | 11 | 13 | 15 |
| 54 | 9 | 11 | 12 | 14 |
| 55 | 8 | 10 | 12 | 14 |
| 56 | 8 | 9 | 11 | 13 |
| 57 | 7 | 9 | 11 | 12 |
| 58 | 7 | 9 | 10 | 12 |
| 59 | 7 | 8 | 10 | 11 |
| 60 | 6 | 8 | 9 | 11 |
| 61 | 6 | 7 | 9 | 10 |
| 62 | 6 | 7 | 8 | 9 |
| 63 | 2 | 2 | 2 | 2 |

FIG.28

| pStateIdx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| transIdxLPS | 0 | 0 | 1 | 2 | 2 | 4 | 4 | 5 | 6 | 7 | 8 | 9 | 9 | 11 | 11 | 12 |
| transIdxMPS | 1 | 2 | 3 | 4 | 5 | 6 | 7 | 8 | 9 | 10 | 11 | 12 | 13 | 14 | 15 | 16 |

| 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|
| 13 | 13 | 15 | 15 | 16 | 16 | 18 | 18 | 19 | 19 | 21 | 21 | 22 | 22 | 23 | 24 |
| 17 | 18 | 19 | 20 | 21 | 22 | 23 | 24 | 25 | 26 | 27 | 28 | 29 | 30 | 31 | 32 |

| 32 | 33 | 34 | 35 | 36 | 37 | 38 | 39 | 40 | 41 | 42 | 43 | 44 | 45 | 46 | 47 |
|---|---|---|---|---|---|---|---|---|---|---|---|---|---|---|---|
| 24 | 25 | 26 | 26 | 27 | 27 | 28 | 29 | 29 | 30 | 30 | 30 | 31 | 32 | 32 | 33 |
| 33 | 34 | 35 | 36 | 37 | 38 | 39 | 40 | 41 | 42 | 43 | 44 | 45 | 46 | 47 | 48 |

| 48 | 49 | 50 | 51 | 52 | 53 | 54 | 55 | 56 | 57 | 58 | 59 | 60 | 61 | 62 | 63 |
|---|---|---|---|---|---|---|---|---|---|---|---|---|---|---|---|
| 33 | 33 | 34 | 34 | 35 | 35 | 35 | 36 | 36 | 36 | 37 | 37 | 37 | 38 | 38 | 63 |
| 49 | 50 | 51 | 52 | 53 | 54 | 55 | 56 | 57 | 58 | 59 | 60 | 61 | 62 | 62 | 63 |

ARITHMETIC DECODING APPARATUS

CROSS REFERENCES TO RELATED APPLICATIONS

The present invention contains subject matter related to Japanese Patent Application JP 2008-049022, filed in the Japan Patent Office on Feb. 29, 2008, the entire contents of which being incorporated herein by reference.

BACKGROUND OF THE INVENTION

1. Field of the Invention

The present invention relates to an arithmetic decoding system. In particular, the present invention relates to an arithmetic decoding apparatus for decoding data encoded with context-adaptive binary arithmetic coding (CABAC).

2. Description of the Related Art

The context-adaptive binary arithmetic coding (CABAC) is a form of entropy coding used in H.264, which has been standardized by ITU-T (International Telecommunication Union—Telecommunication standardization sector) (see ITU-T H.264). In the CABAC, various types of non-binary data are converted to binary so as to be represented as symbols of "0" or "1" before encoding. Then, they are encoded by a binary arithmetic coding process. At the time of decoding, the inverse of the above process is performed.

The binary arithmetic coding process is a process of converting the data represented as the symbols of "0" or "1" from a {0, 1} form into an {LPS, MPS} form, where a most probable symbol (MPS) is one of the symbols "0" and "1" that is expected to occur the more likely and a least probable symbol (LPS) is the other of the symbols "0" and "1." Then, the binary data, which is represented by two symbols of the LPS and the MPS, is encoded by arithmetic coding. Whether the MPS is "0" or "1" is determined by estimation for each symbol, based on already processed data. Specifically, at the time of encoding, the value of the MPS for a symbol that is to be encoded next is determined based on already encoded data alone, whereas at the time of decoding, the value of the MPS for a symbol that is to be decoded next is determined based on already decoded data alone.

In addition, in the binary arithmetic coding process, processing is performed while suitable probability models (contexts) are adopted one after another, from among a plurality of previously prepared probability models (contexts), depending on the current state. In the CABAC, context variables corresponding to the contexts are stored in a context variable table, and a context variable context[ctxIdx] is identified by a context index (ctxIdx). Each context variable is composed of a probability state index pStateIdx, which represents a probability of occurrence, and valMPS, which represents the most probable symbol (MPS), which is the more likely to occur. The probability state index pStateIdx represents an estimated value of the probability of the occurrence of the LPS in the current context, by one of previously defined probability states of 0 to 63. In addition, valMPS indicates whether the symbol that is the MPS is "0" or "1." Note that, in each context variable, the probability state index is expressed as context[ctxIdx].pStateIdx, and the MPS is expressed as context[ctxIdx].valMPS.

FIG. 26 illustrates a concept of a decoding process in the CABAC. A decoder in the CABAC holds codIRange and codIOffset as internal state variables. In codIRange is stored a 9-bit value representing the width of a range that is assigned as a range corresponding to 100% probability of the occurrence of a next symbol. Therefore, a range that can be specified by codIRange is from 0 to 511. In codIOffset is stored a 9-bit value representing a code that is an object to be decoded. At the time of initialization, top 9 bits in a sequence of codes are read into codIOffset, whereas codIRange is set to 0x1FE (a number that follows "0x" represents a hexadecimal number. This is also true in the following descriptions).

Within codIRange, the width of a range assigned to an estimated probability of the occurrence of the MPS is codIRangeMPS, and the width of a range assigned to an estimated probability of the occurrence of the LPS is codIRangeLPS. Thus, if the value of codIOffset is equal to or greater than codIRangeMPS, a symbol of the LPS is decoded, whereas if the value of codIOffset is not equal to or greater than codIRangeMPS, a symbol of the MPS is decoded. With the value of 7th and 6th bits of codIRange, codIRange[7:6], as qCodIRangeIdx, codIRangeLPS is determined by referring to a table rangeTabLPS[pStateIdx][qCodIRangeIdx] as illustrated in FIG. 27. Meanwhile, codIRangeMPS is obtained by subtracting codIRangeLPS from codIRange.

As a result of decoding, valMPS is outputted as decoded data in the case of the MPS, whereas an inverse value of valMPS is outputted as the decoded data in the case of the LPS. Then, update of the internal state variables, codIRange and codIOffset, and update of the context variable context[ctxIdx] are performed. In the update of these values, processing varies depending on whether a decoding result is the MPS or the LPS.

(1) In the case where the decoding result is the MPS, pStateIdx transitions to transIdxMPS[context[ctxIdx].pStateIdx] in accordance with transIdxMPS in a transition table as illustrated in FIG. 28. Meanwhile, the value of valMPS remains context[ctxIdx].valMPS. The context variable context[ctxIdx] is updated so as to have these values. Meanwhile, codIOffset is not updated, whereas codIRange is updated to the value of codIRangeMPS.

(2) In the case where the decoding result is the LPS, pStateIdx transitions to transIdxLPS[context[ctxIdx].pStateIdx] in accordance with transIdxLPS in the transition table as illustrated in FIG. 28. At this time, the value of valMPS is changed to an inverse value of context[ctxIdx].valMPS if transIdxLPS[context[ctxIdx].pStateIdx] is "0," whereas the value of valMPS remains the value of context[ctxIdx].valMPS if transIdxLPS[context[ctxIdx].pStateIdx] is not "0." That is, if the LPS is decoded when pStateIdx=0, i.e., when the estimated value of the probability of the occurrence of the LPS is the greatest, it is determined that the symbol of the LPS has become the most probable, and accordingly the value of valMPS is inverted. Under any other condition, it is determined that the symbol of the MPS still remains the most probable, and accordingly the value of valMPS is not changed. The context variable context[ctxIdx] is updated so as to have these values. Moreover, the value of codIOffset is updated to the value of (codIOffset−codIRangeMPS), whereas the value of codIRange is updated to the value of codIRangeLPS.

The internal state variables are further subjected to updating and stream input in a renormalization process RenormD. In this renormalization process, codIRange is shifted to the left until codIRange becomes equal to or greater than 0x100 (=256). At the same time, codIOffset is shifted to the left by as many bits as codIRange is shifted to the left. At this time, one bit is inputted from a stream (encoded data) each time codIOffset is shifted to the left by one bit, whereby the 1-bit value of an LSB of codIOffset is updated. In this manner, the same number of bits are inputted from the input stream as the number of bits by which codIOffset is shifted to the left. In the case where codIRange is initially equal to or greater than 0x100, the internal state variables are not updated in the renormalization process. The above is a description of the decoding process for one symbol, and when each subsequent symbol is decoded, a similar process is repeated using ctxIdx newly calculated, so that the subsequent symbols are decoded one after another. Note that, hereinafter, the term "to shift" will be used to refer to "to shift to the left," i.e., "to shift from the LSB side towards the MSB side."

FIGS. 29 and 30 illustrate an exemplary circuit structure for a known binary arithmetic code decoding process in the CABAC as described above. FIGS. 31, 32, 33, and 34 illustrate procedures for the known binary arithmetic code decoding process in the CABAC.

When one symbol is decoded, pStateIdx and valMPS are read from the context variable table (step S901). The value of the 7th and 6th bits of the internal state variable codIRange is set in qCodIRangeIdx (step S902). Then, a reference value of rangeTabLPS[pStateIdx][qCodIRangeIdx] is set in codIRangeLPS, and a value obtained by subtracting codIRangeLPS from codIRange is set in codIRangeMPS (step S903).

At this time, if codIOffset is equal to or greater than codIRangeMPS (step S906), the decoding result is the LPS, and codIOffset is updated to a value obtained by subtracting codIRangeMPS from codIOffset, and codIRange is updated to the value of codIRangeLPS (step S907). In addition, the context variable is updated (step S910).

Meanwhile, if codIOffset is less than codIRangeMPS (step S906), the decoding result is the MPS, and codIRange is updated to the value of codIRangeMPS (step S908). In addition, the context variable is updated (step S920).

Thereafter, the internal state variables, codIRange and codIOffset, are subjected to the renormalization process (step S930).

In the case where the decoding result is the LPS (step S910), the inverse value of valMPS is outputted as decoded data (step S911). The next state of pStateIdx is derived from transIdxLPS[pStateIdx] in the transition table (step S912). At this time, if the value of transIdxLPS[pStateIdx] is "0" (step S913), the value of valMPS is inverted (step S914). Then, the context variable is updated so as to have the thus obtained values of pStateIdx and valMPS (step S915).

In the case where the decoding result is the MPS (step S920), the value of valMPS is outputted as decoded data (step S921). The next state of pStateIdx is derived from transIdxMPS[pStateIdx] in the transition table, and the context variable is updated so as to have the derived value of pStateIdx (step S922).

In the renormalization process (step S930), if codIRange is less than 0x0100 (=256) (step S931), both codIRange and codIOffset are shifted to the left bit by bit while one bit of the stream (the encoded data) is inputted into the LSB of codIOffset (step S932), until codIRange becomes equal to or greater than 0x0100.

SUMMARY OF THE INVENTION

The decoding process in the CABAC is very complicated as described above, and a plurality of symbols can be compressed into a single bit, and it is therefore possible that a plurality of symbols be decoded without any bit of the stream being read. Accordingly, it is likely that the decoding process for one symbol need be repeated more times than the number of bits of the code. Moreover, it is generally difficult to predict the number of times the decoding process need be repeated. Furthermore, because a multilevel conversion process is necessary, the amount of processing is greater than that in the case of decoding of a variable-length code such as a Huffman code. Specifically, a maximum of 36 symbols can be compressed into a single bit, and there is much greater variation in the amount of processing than in the case of the decoding of the variable-length code. Because of this, there has been a demand to minimize the number of processing cycles per symbol for the CABAC decoding process, when the stream to be decoded has a high bit rate.

In the case where a binary arithmetic code processing circuit is implemented by the circuit structures as illustrated in FIGS. 29 and 30, the processing is complicated since it involves many processes such as those by a shifter, a subtractor, a comparator, a table reference circuit, and a selector, and memory access, and this makes it difficult to implement a circuit that can be driven at a high operating frequency to decode one or more symbols per cycle. Moreover, completion of the decoding of a previous symbol is required to determine information that is necessary for the decoding of a next symbol, and to start a next decoding process; hence the necessity for sequential processing. It is therefore difficult to improve efficiency by increasing a circuit scale and implementing parallel processing.

The present invention addresses the above-identified, and other problems associated with existing methods and apparatuses, and aims to improve performance of a context-adaptive binary arithmetic decoding process by simplifying the decoding process by decreasing the number of processing cycles per encoded bit, instead of by decreasing the number of processing cycles per decoded symbol.

According to one embodiment of the present invention, there is provided an arithmetic decoding apparatus that decodes encoded data while updating a first state variable (e.g., codIRange) and a second state variable (e.g., codIOffset) based on a first context variable (e.g., pStateIdx[i]) and a second context variable (e.g., valMPS[i]), the first state variable being a basis for the decoding, the second state variable being an object to be decoded, the first context variable representing a probability state, the second context variable representing a most probable symbol, the arithmetic decoding apparatus including: a decoding information table that stores transitions of a range (e.g., codIRangeMPS[i]) of the most probable symbol and a range (e.g., codIRangeLPS[i]) of a least probable symbol within a range identified by the first context variable, and a number (e.g., sftL) of a symbol for which the range of the most probable symbol becomes less than a specific value, the decoding information table being referred to based on the first state variable and the first context variable; a number-of-symbols determination section configured to determining the number (e.g., a length L) of symbols in the encoded data that are to be decoded collectively, based on the transitions of the range of the most probable symbol and the range of the least probable symbol, the number of the symbol for which the range of the most probable symbol becomes less than the specific value, and the second state variable; and an output section configured to decode a symbol corresponding to the number of symbols that are to be decoded collectively, based on the second context variable, and outputting the decoded symbol. This makes it possible to identify a symbol or symbols that can be decoded collectively, based on information that is referred to based on the first state variable and the first context variable.

The present invention can improve the performance of a decoding process in a context-adaptive binary arithmetic decoding process, while at the same time reducing the scale of circuitry and so on.

BRIEF DESCRIPTION OF THE DRAWINGS

FIG. 24 illustrates a table showing a classification of the number of tuples when a table is generated, according to an embodiment of the present invention;

FIG. 25 illustrates a table showing a classification of the number of occurrences of a length L permitting collective decoding, according to an embodiment of the present invention;

FIG. 27 illustrates a table rangeTabLPS[pStateIdx][qCodIRangeIdx] in the CABAC;

FIG. 28 illustrates a transition table transIdxLPS and transIdxMPS in the CABAC;

DETAILED DESCRIPTION OF THE PREFERRED EMBODIMENT

Next, a preferred embodiment of the present invention will be described in detail below, with reference to the accompanying drawings.

Figure 1:
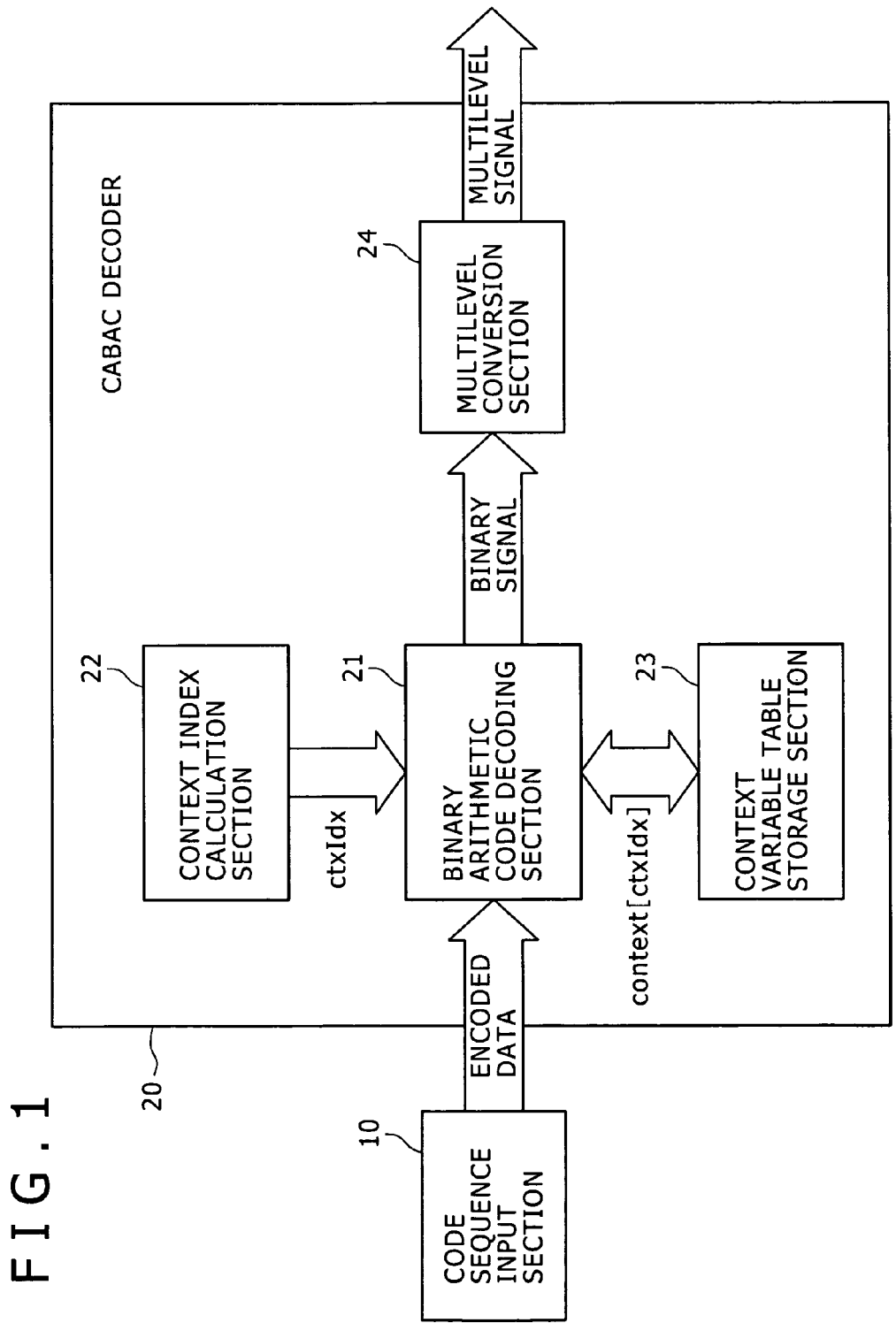
FIG. 1 illustrates an exemplary structure of a CABAC decoder according to an embodiment of the present invention.

FIG. 1 illustrates an exemplary structure of a CABAC decoder 20 according to an embodiment of the present invention. The CABAC decoder 20 receives encoded data from a code sequence input section 10, decodes the encoded data to obtain a corresponding binary signal, and thereafter converts the binary signal into multilevel form to obtain a corresponding multilevel signal. The CABAC decoder 20 includes a binary arithmetic code decoding section 21, a context index calculation section 22, a context variable table storage section 23, and a multilevel conversion section 24.

The context index calculation section 22 calculates a context index (ctxIdx), and supplies the calculated context index ctxIdx to the binary arithmetic code decoding section 21.

The context variable table storage section 23 stores a context variable table, which contains context variables corresponding to contexts. Each of the context variables is composed of a probability state index pStateIdx, which represents a probability of occurrence, and valMPS, which represents a most probable symbol (MPS), which is the more likely to occur. The context variable stored in the context variable table storage section 23 can be identified by ctxIdx, and is expressed as context[ctxIdx]. At this time, the probability state index identified by ctxIdx is expressed as context[ctxIdx].pStateIdx, whereas the MPS identified by ctxIdx is expressed as context[ctxIdx].valMPS.

The binary arithmetic code decoding section 21 decodes the encoded data inputted from the code sequence input section 10 to obtain the corresponding binary signal. When decoding one symbol, the binary arithmetic code decoding section 21 receives ctxIdx from the context index calculation section 22, and acquires the context variable context[ctxIdx] from the context variable table storage section 23 based on ctxIdx. Then, the binary arithmetic code decoding section 21 decodes the symbol based on this context variable, and outputs the resulting binary signal to the multilevel conversion section 24.

The multilevel conversion section 24 converts the binary signal outputted from the binary arithmetic code decoding section 21 into multilevel form to recover an original multilevel signal. In binary arithmetic coding, the multilevel signal is converted to a corresponding binary signal in accordance with a syntax element (SE). As such, the multilevel conversion section 24 performs a process of converting the binary signal back to the original multilevel signal. Here, the syntax element is information that is defined in H.264 to be transferred with a syntax.

Each symbol is decoded in the CABAC decoder 20 having the above-described structure. Now, focus will be placed on a renormalization process that is to be performed for each decoding result. As is apparent from FIG. 27, all values stored in rangeTabLPS are less than 0x100 (=256), and therefore, codIRangeLPS, to which one of the values is assigned, is always less than 0x100. Therefore, every time an LPS is decoded, one or more shifts necessarily occur. Meanwhile, rangeTabLPS is defined such that every time an MPS is decoded, codIRange necessarily becomes equal to or greater than 0x80 (=128), and accordingly codIRange becomes equal to or greater than 0x100 as a result of at least one shift. Thus, there are only two cases: the case where no shift is performed; and the case where only one shift is performed. The fact that there is the case where no shift is performed means that there is the case where codIOffset is not changed and a need to input a new code is not created, even after the decoding of a symbol.

Figure 31:
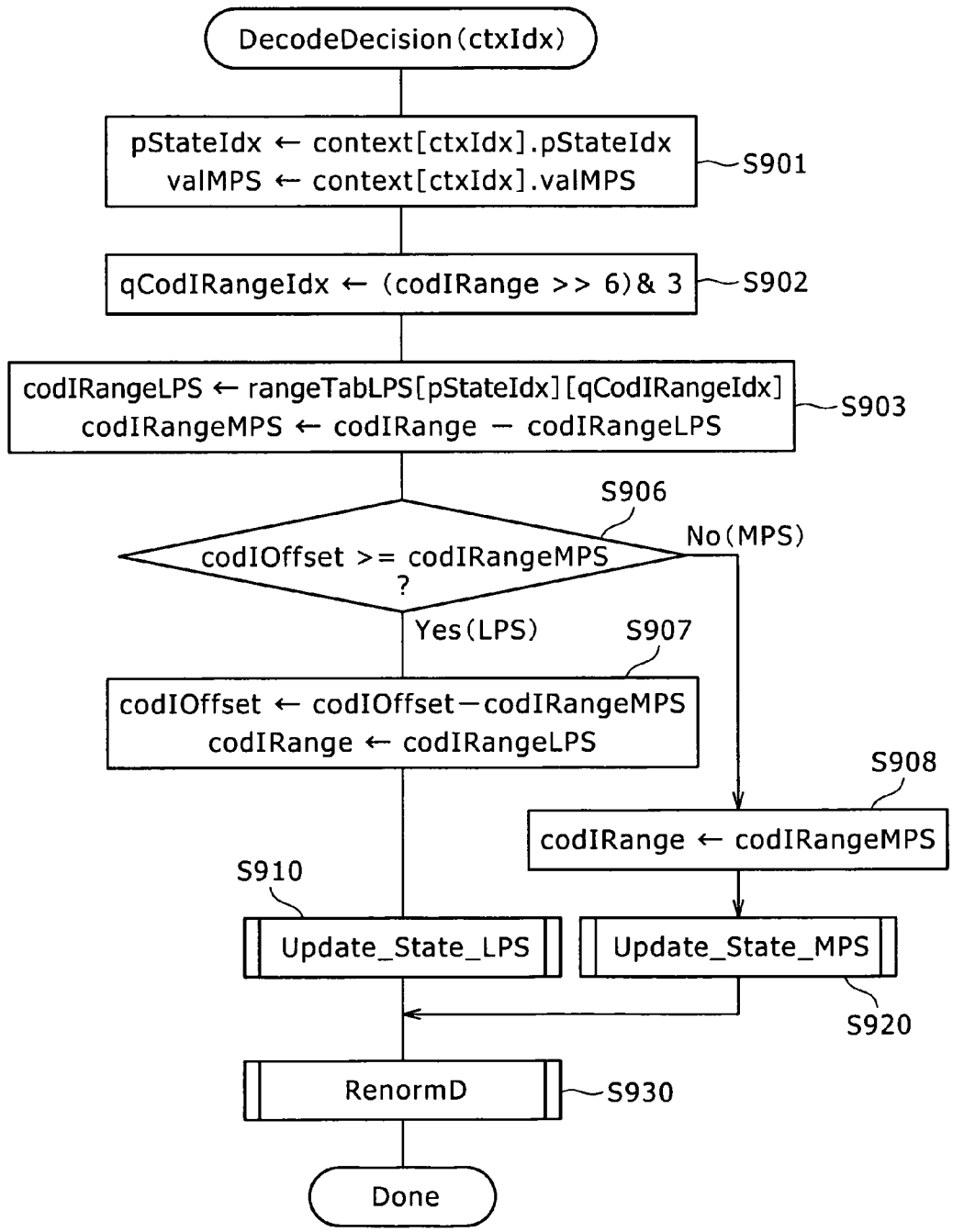
FIG. 31 illustrates a procedure for a known binary arithmetic code decoding process in the CABAC.
Figure 32:
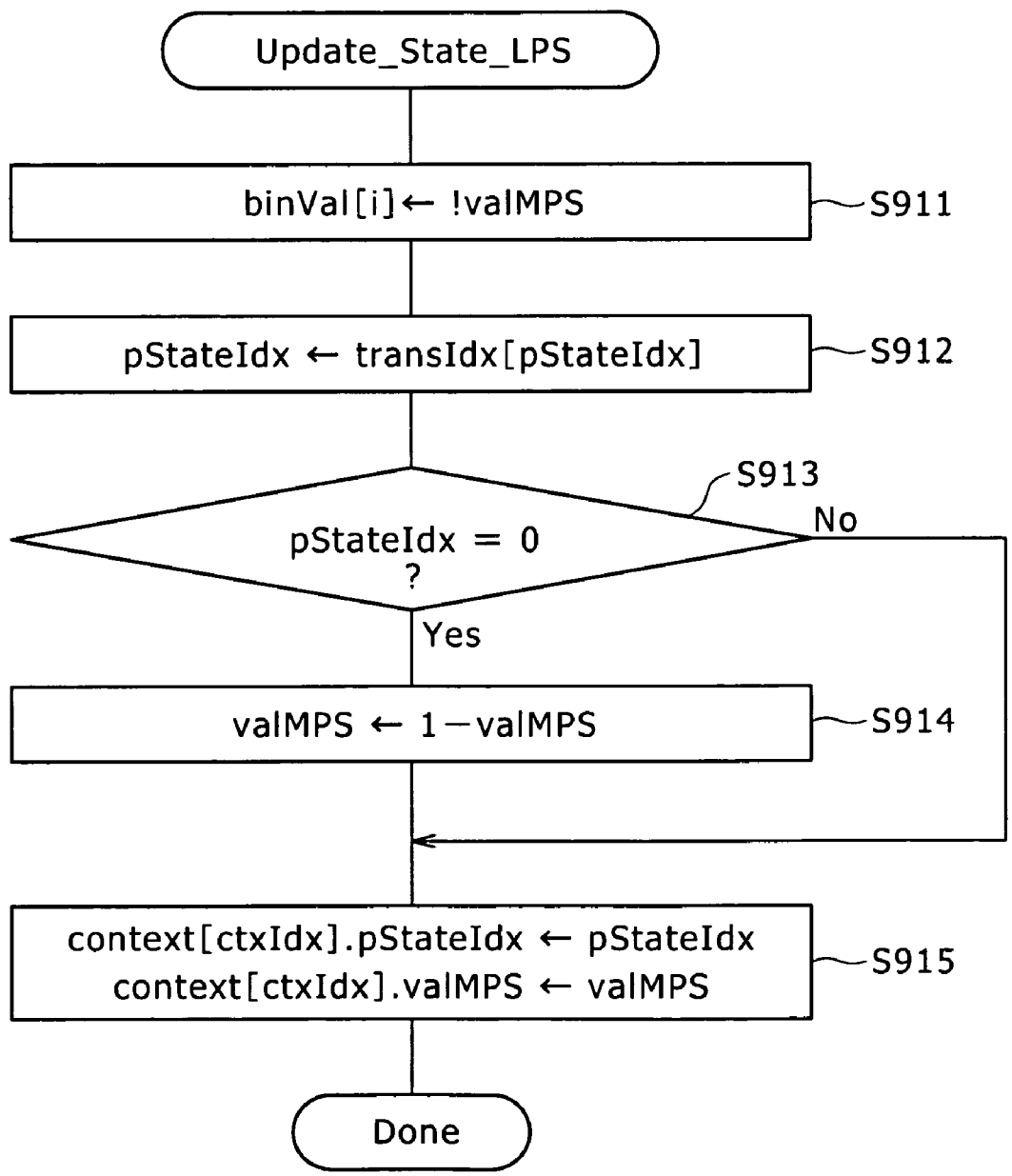
FIG. 32 illustrates a procedure for a known update process in the case of the LPS in the CABAC.
Figure 33:
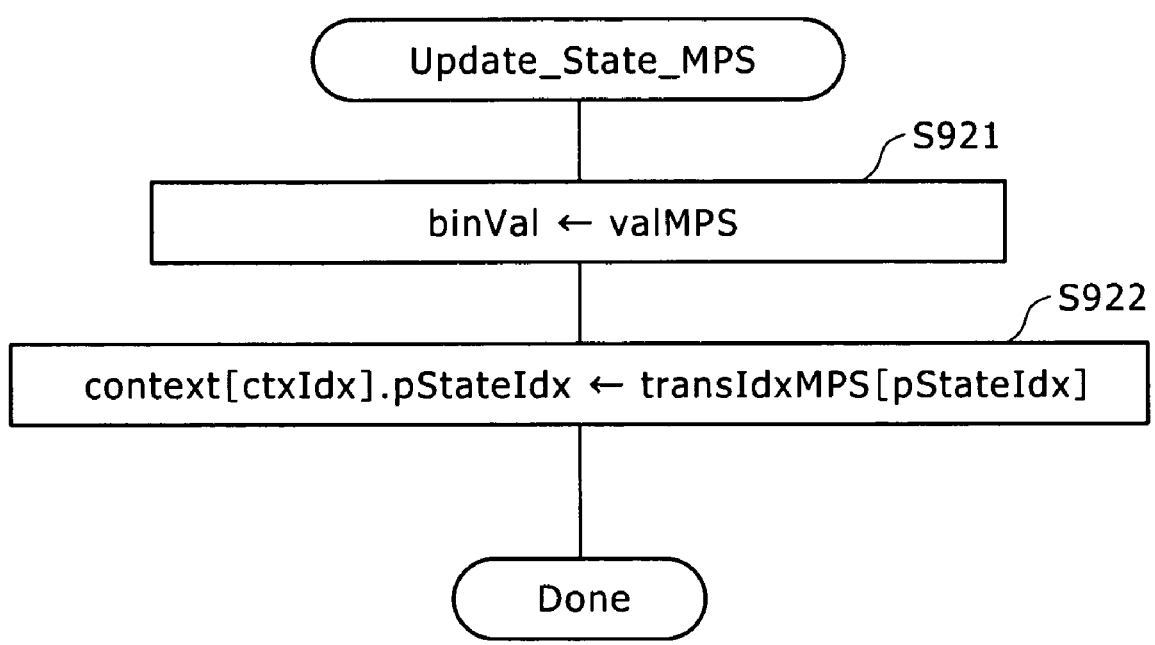
FIG. 33 illustrates a procedure for a known update process in the case of the MPS in the CABAC.
Figure 34:
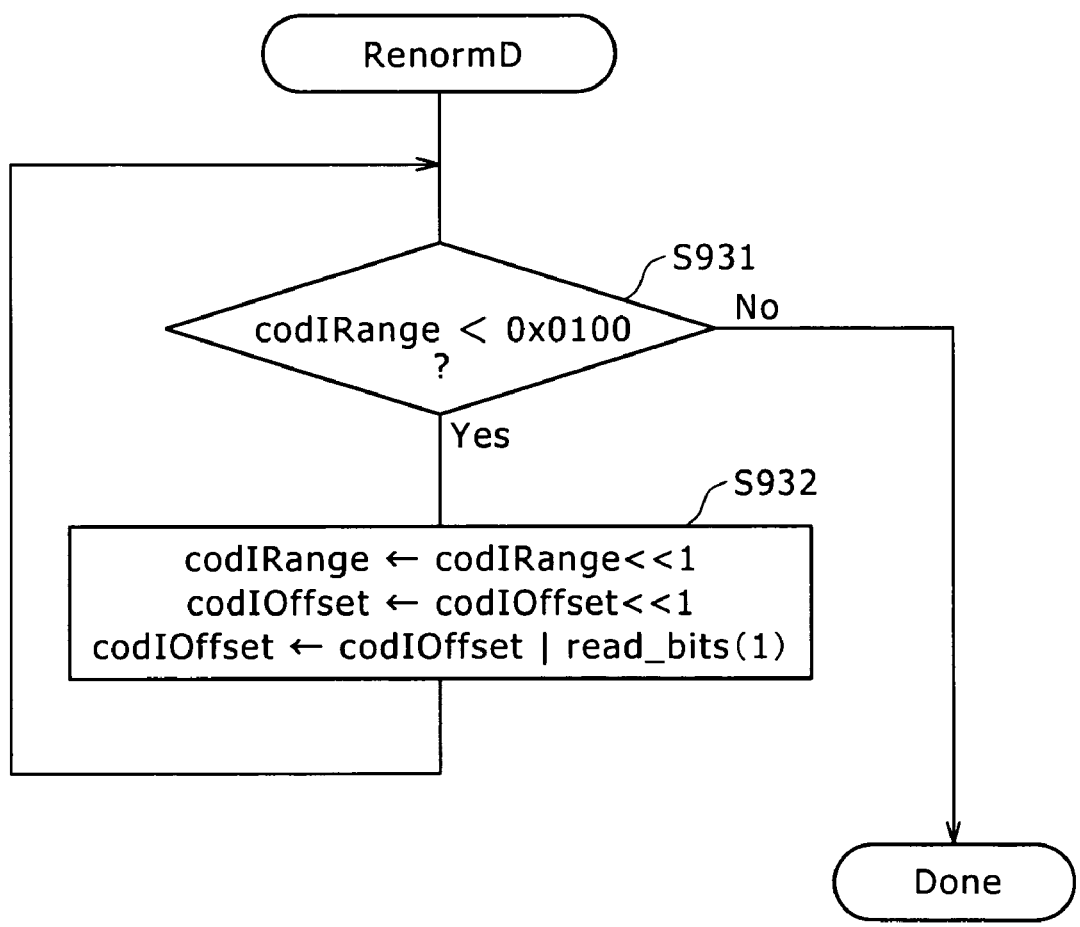
FIG. 34 illustrates a procedure for a known renormalization process in the CABAC.
Figure 35:
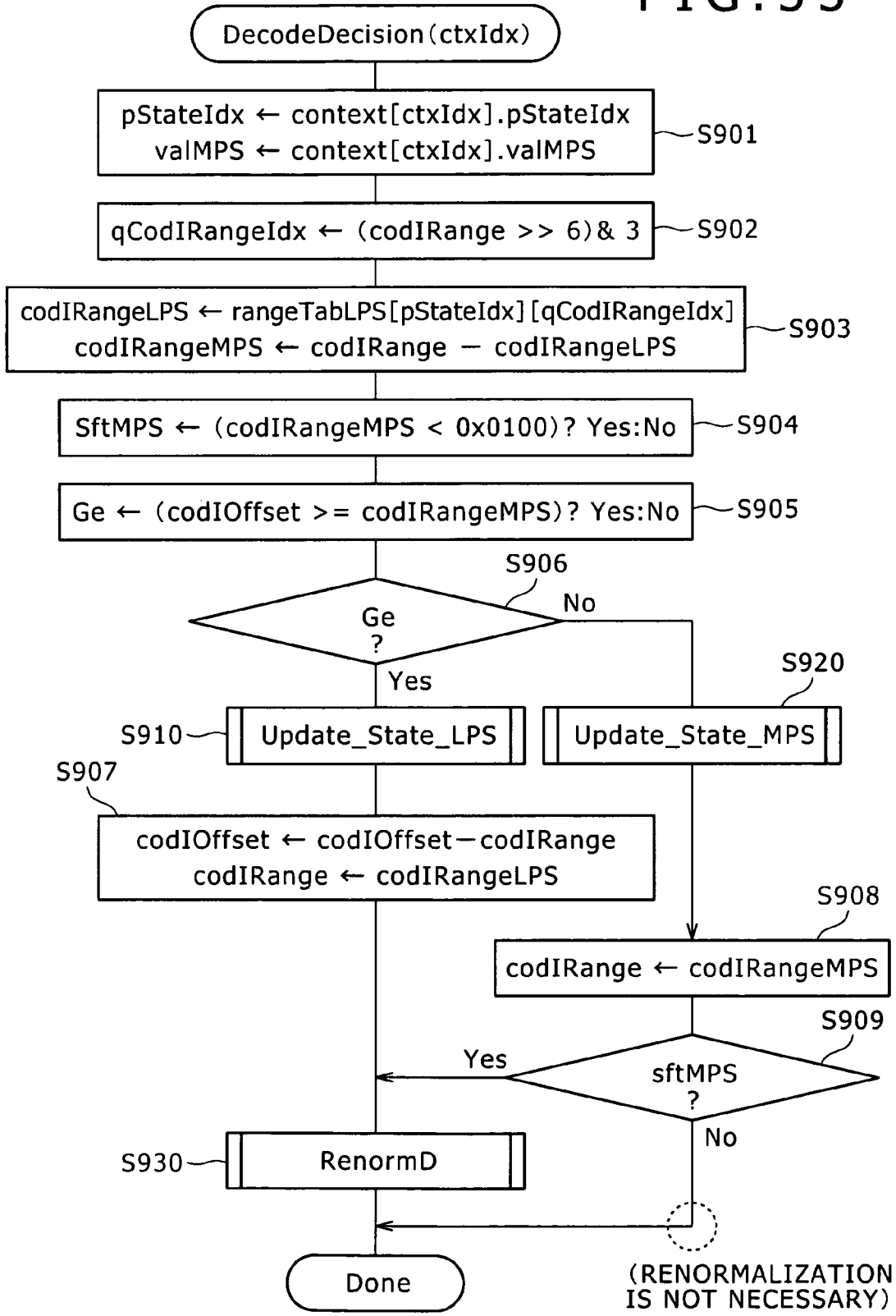
FIG. 35 illustrates an exemplary variation of the procedure for the known binary arithmetic code decoding process in the CABAC.

FIG. 35 illustrates a procedure for a known binary arithmetic code decoding process in the CABAC as modified in form. In other words, a flow of FIG. 35 is changed from that of FIG. 31 so as to make it clearer that when the MPS is decoded, a shift does not occur if codIRange >=0x100, and therefore codIOffset is not updated in the renormalization process. Note, however, that the processes to be performed in the procedure of FIG. 35 are essentially the same as those performed in the procedure of FIG. 31. Specifically, in the procedure of FIG. 35, a flag SftMPS, which indicates whether a shift need be performed in the case of the MPS, is introduced; this flag SftMPS is referred to before starting the renormalization process; the renormalization process is performed only when the flag SftMPS indicates that a shift need be performed; and the renormalization process is not performed when the flag SftMPS does not indicate that a shift need be performed. The flag SftMPS stores "Yes" when codIRange<0x100, whereas the flag SftMPS stores "No" when codIRange >=0x100. In other words, if the flag SftMPS stores "Yes," that means that a shift need be performed, whereas if the flag SftMPS stores "No," that means that a shift need not be performed.

This embodiment of the present invention takes advantage of the fact that, as described above, there is the case where a shift does not occur when the MPS has been decoded, and decodes a sequence of symbols collectively in the case of "one or more continuous MPSs" or "zero or more continuous MPSs followed by one LPS." Notice here that the case of "one or more continuous MPSs" encompasses the case of "one MPS," and that the case of "zero or more continuous MPSs followed by one LPS" encompasses the case of "one LPS." Therefore, any data can be divided into a plurality of sequences of symbols each of which is of one of the above two types. Thus, any data can be decoded by decoding those sequences of symbols each at a time.

Suppose that when a plurality of symbols are decoded in succession from a certain time point, all L symbols are the MPS and the decoding of the L symbols never involves a shift (i.e., each instance passes through a point indicated by a broken-line circle in FIG. 35, and the renormalization process is not performed at all). In this case, codIOffset remains the same all the time. Focus will now be placed on two conditions that satisfy the above condition.

Regarding a first condition, focus is placed on the fact that a shift occurs when codIRange becomes less than 0x100. If it is possible to calculate codIRangeMPS[i] (i=0, . . . , L−1) for the L symbols based on codIRange that is used when the first symbol is decoded, it is possible to calculate a length sftL until an ith flag SftMPS[i] becomes "Yes." The flag SftMPS[i] stores "Yes" when codIRangeMPS[i]<0x100, whereas the flag SftMPS[i] stores "No" when codIRangeMPS[i]>= 0x100. In other words, if the flag SftMPS[i] stores "Yes," that means that a shift need be performed, whereas if the flag SftMPS[i] stores "No," that means that a shift need not be performed. Note that when all of the flags SftMPS[0] to SftMPS[L−1] store "No," sftL is L.

Regarding a second condition, focus is placed on the fact that the decoding result becomes the LPS when codIRangeMPS has become equal to or less than codIOffset. It is possible to calculate a length geL of continuous MPSs based on a flag Ge[i] that compares codIOffset with codIRangeMPS[i] (i=0, . . . , sftL−1) for sftL symbols. The flag Ge[i] stores "Yes" when codIOffset >=codIRangeMPS [i], whereas the flag Ge[i] stores "No" when codIOffset>codIRangeMPS[i]. In other words, if the flag Ge[i] stores "Yes," that means that the LPS has been decoded, whereas if the flag Ge[i] stores "No," that means that the MPS has been decoded. Accordingly, the flag Ge[i] is obtained one after another from when the time when i=0 until the time when i=sftL−1. The length geL until Ge[i] becomes "Yes" for the first time indicates the number of continuous MPSs.

The smaller one of the values of sftL and geL, which are generated based on the above two conditions, indicates a length L of the duration of a situation where "the MPS continues and no shift occurs." Because SftMPS[i] and Ge[i] can be obtained in parallel, sftL and geL can be generated independently of each other.

Because it is assumed here that codIOffset is constant, it is possible to calculate codIRangeMPS[i], regardless of codIOffset, based on pStateIdx for each symbol and codIRange that is used when decoding the first symbol.

Note that pStateIdx for each symbol is independent when each ctxIdx[i] is different from the other, and that therefore, separate context variables are used. In the case of three symbols, for example, the following equations (Eq. 1, Eq. 2, and Eq. 3) hold:

$$pStateIdx[0]=context[ctxIdx[0]].pStateIdx \quad\quad (Eq. 1)$$

$$pStateIdx[1]=context[ctxIdx[1]].pStateIdx \quad\quad (Eq. 2)$$

$$pStateIdx[2]=context[ctxIdx[2]].pStateIdx \quad\quad (Eq. 3)$$

In the case where the same context is used, it is necessary that, on the assumption of the MPS, the next state of pStateIdx be derived from transIdxMPS[pStateIdx] based on pStateIdx for the previous decoding. In the case where each of ctxIdx[0], ctxIdx[1], and ctxIdx[2] refers to the same context variable, for example, the following equations (Eq. 4, Eq. 5, and Eq. 6) hold:

$$\text{pStateIdx}[0] = \text{context}[\text{ctxIdx}[0]].\text{pStateIdx} \quad (Eq. 4)$$

$$\text{pStateIdx}[1] = \text{transIdxMPS}[\text{pStateIdx}[0]] \quad (Eq. 5)$$

$$\text{pStateIdx}[2] = \text{transIdxMPS}[\text{pStateIdx}[1]] \quad (Eq. 6)$$

As long as processing concerning context indexes ctxIdx that are dependent on each other is performed so as not to involve a contradiction in the above-described manner, it is possible to calculate codIRangeMPS[i] regardless of codIOffset, and also to calculate SftMPS[i] based on codIRangeMPS[i] in a similar manner. Specifically, in the case of three symbols, for example, the following equations (Eq. 7, Eq. 8, Eq. 9, Eq. 10, Eq. 11, Eq. 12, Eq. 13, Eq. 14, and Eq. 15) hold:

$$\text{codIRangeLPS}[0] = \text{rangeTabLPS}[\text{pStateIdx}[0]][(\text{codIRange} \gg 6) \& 3] \quad (Eq. 7)$$

$$\text{codIRangeMPS}[0] = \text{codIRange} - \text{codIRangeLPS}[0] \quad (Eq. 8)$$

$$\text{codIRangeLPS}[1] = \text{rangeTabLPS}[\text{pStateIdx}[1]][(\text{codIRangeMPS}[0] \gg 6) \& 3] \quad (Eq. 9)$$

$$\text{codIRangeMPS}[1] = \text{codIRangeMPS}[0] - \text{codIRangeLPS}[1] \quad (Eq. 10)$$

$$\text{codIRangeLPS}[2] = \text{rangeTabLPS}[\text{pStateIdx}[2]][(\text{codIRangeMPS}[1] \gg 6) \& 3] \quad (Eq. 11)$$

$$\text{codIRangeMPS}[2] = \text{codIRangeMPS}[1] - \text{codIRangeLPS}[2] \quad (Eq. 12)$$

$$\text{SftMPS}[0] = (\text{codIRangeMPS}[0] >= 0x0100) \,?\, \text{Yes}:\text{No} \quad (Eq. 13)$$

$$\text{SftMPS}[1] = (\text{codIRangeMPS}[1] >= 0x0100) \,?\, \text{Yes}:\text{No} \quad (Eq. 14)$$

$$\text{SftMPS}[2] = (\text{codIRangeMPS}[2] >= 0x0100) \,?\, \text{Yes}:\text{No} \quad (Eq. 15)$$

It is apparent from the above that sftL, codIRangeMPS[i], and codIRangeLPS[i] are determined only based on pStateIdx[i] and codIRange. Accordingly, in this embodiment of the present invention, they are calculated beforehand and stored as a table, and a subsequent symbol decoding information table is prepared that can be referenced to obtain sftL, codIRangeMPS[i], and codIRangeLPS[i] ($i=0, \ldots, tL-1$) based on pStateIdx[i] ($i=0, \ldots, \text{maxL}-1$) and codIRange. Here, tL is a maximum symbol length that is supported by this table. The aforementioned maxL need be determined so as to satisfy $\text{maxL} \leq tL$. Use of the subsequent symbol decoding information table allows immediate determination of the length of the "continuous MPSs before the first decoding of the LPS" or the "continuous MPSs before the first occurrence of a shift" based on pStateIdx[i] ($i=0, \ldots, \text{maxL}-1$), codIRange, and codIOffset, and allows the collective decoding of the "one or more continuous MPSs" or the "zero or more continuous MPSs followed by one LPS" in one or two cycles.

Moreover, the conversion into binary form, i.e., from {MPS, LPS} to {0, 1}, can be accomplished collectively using valMPS of the corresponding context variables. However, a process of updating valMPS is necessary. Only when the LPS has been decoded, valMPS can be inverted. When the "one or more continuous MPSs" are decoded, the update of valMPS is not necessary because the MPSs alone are decoded. When the "zero or more continuous MPSs followed by one LPS" are decoded, the inversion of valMPS can occur only once because the number of LPSs is one. Therefore, the determination as to whether the inverting process is to be performed need be performed only with respect to a context for which the LPS has been decoded. If it is determined that the inverting process is necessary, the value of valMPS is inverted and thus updated, whereas if it is not determined that the inverting process is necessary, the value of valMPS is not updated.

The collective decoding of a plurality of symbols is accomplished in the above-described manner, and this process of collective decoding is repeated until the decoding of a target number of symbols is completed, so that the decoding of an entire code sequence is accomplished.

Figure 2:
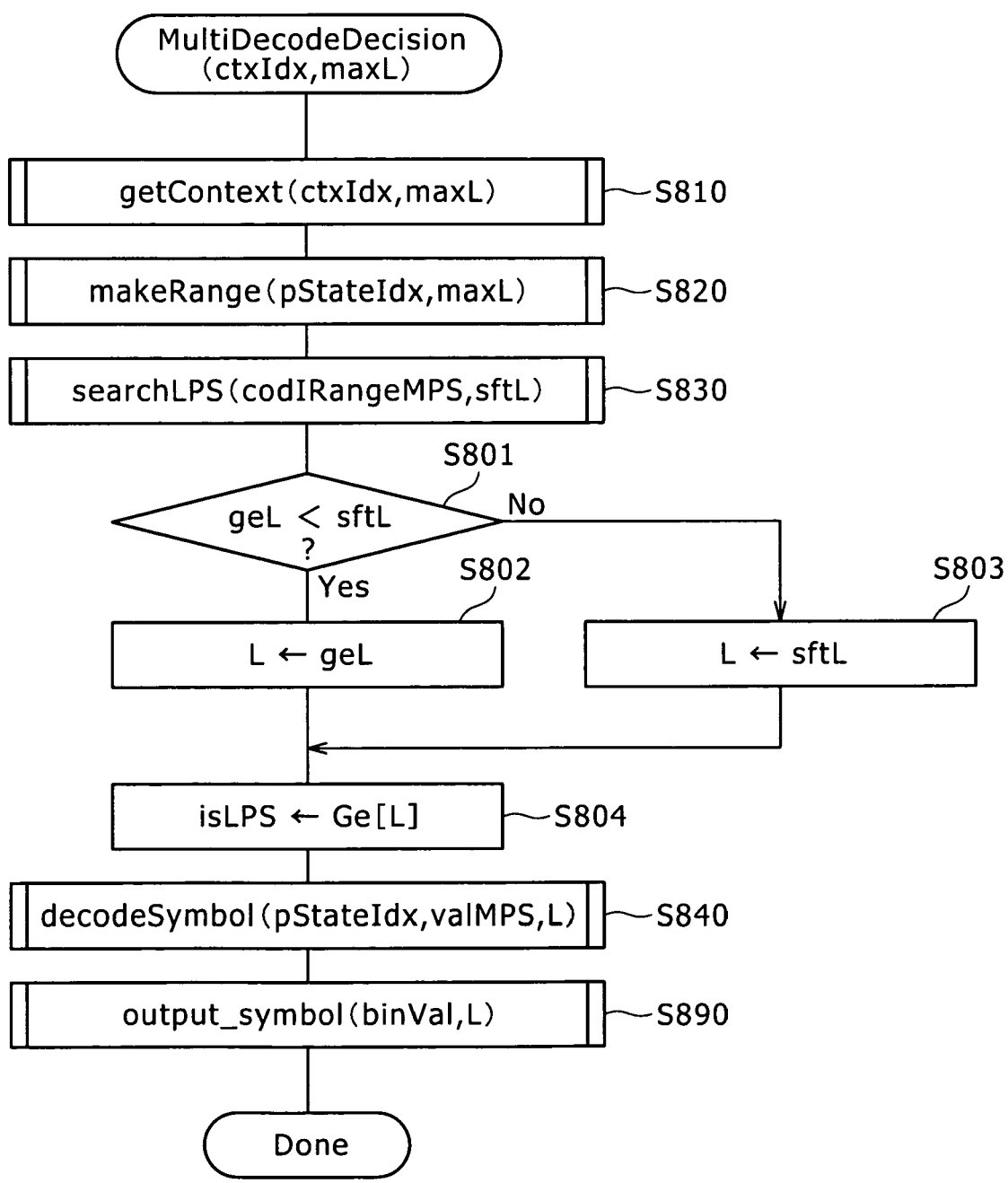
FIG. 2 illustrates an exemplary procedure for a decoding process according to an embodiment of the present invention.

FIG. 2 illustrates an exemplary procedure for the decoding process according to this embodiment of the present invention. In the decoding process according to this embodiment of the present invention, L symbols that have been encoded with context-adaptive binary arithmetic coding (CABAC) are decoded collectively. In this collective decoding process (MultiDecodeDecision), first, the context variable is acquired based on the context index (ctxIdx) calculated by the context index calculation section 22 (step S810). An upper limit value at this time is given by maxL. In other words, a maximum number of symbols that can be decoded collectively is maxL, and in subsequent processing, the number L of symbols that can be decoded collectively is determined such that L does not exceed maxL.

Then, codIRangeLPS[i] and codIRangeMPS[i] are determined based on the acquired context variable, the flag SftMPS[i] is generated, and sftL is determined based on SftMPS[i] (step S820). Also, the flag Ge[i] is generated, and geL is determined based on the flag Ge[i] (step S830). As a result, if geL is less than sftL (step S801), L is set to geL (step S802), whereas if geL is not less than sftL, L is set to sftL (step S803). In other words, L is set to the smaller one of the values of sftL and geL. Note that L indicates the length of the duration of the situation where "the MPS continues and no shift occurs," i.e., the number of symbols that can be decoded collectively.

The value of the Lth flag Ge[L] is set in is LPS (step S804). That is, is LPS is set to "Yes" when an Lth symbol is the LPS, whereas is LPS is set to "No" when the Lth symbol is the MPS.

Thereafter, the update of the context variable and the internal state variables is performed (step S840). This update process includes the renormalization process. The binary signal resultant from the above-described decoding is outputted to the multilevel conversion section 24 (step S890).

Figure 3:
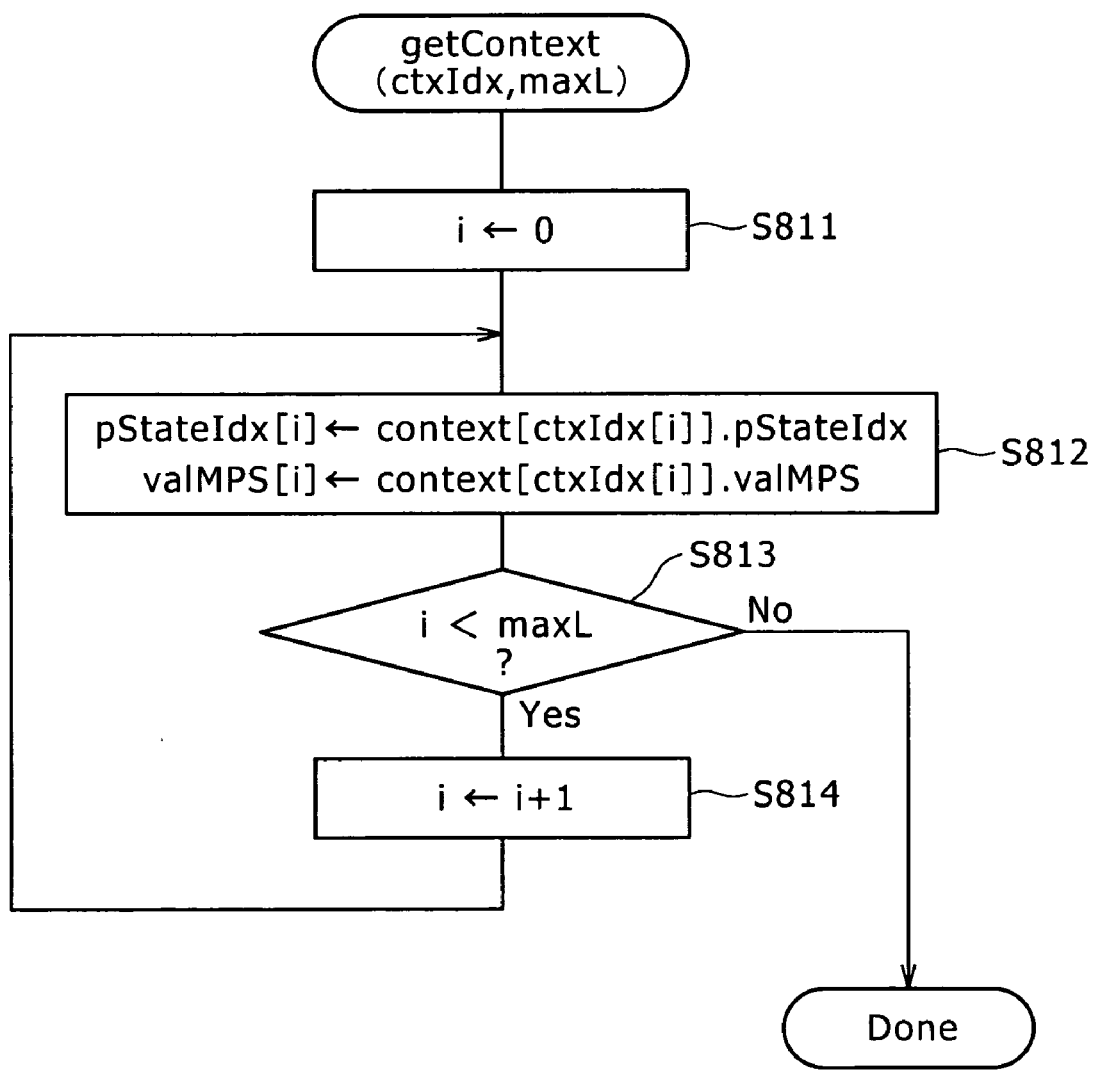
FIG. 3 illustrates an exemplary procedure for a process (step S810) of acquiring a context variable (in the case where each ctxIdx is different from the other) according to an embodiment of the present invention.
Figure 4:
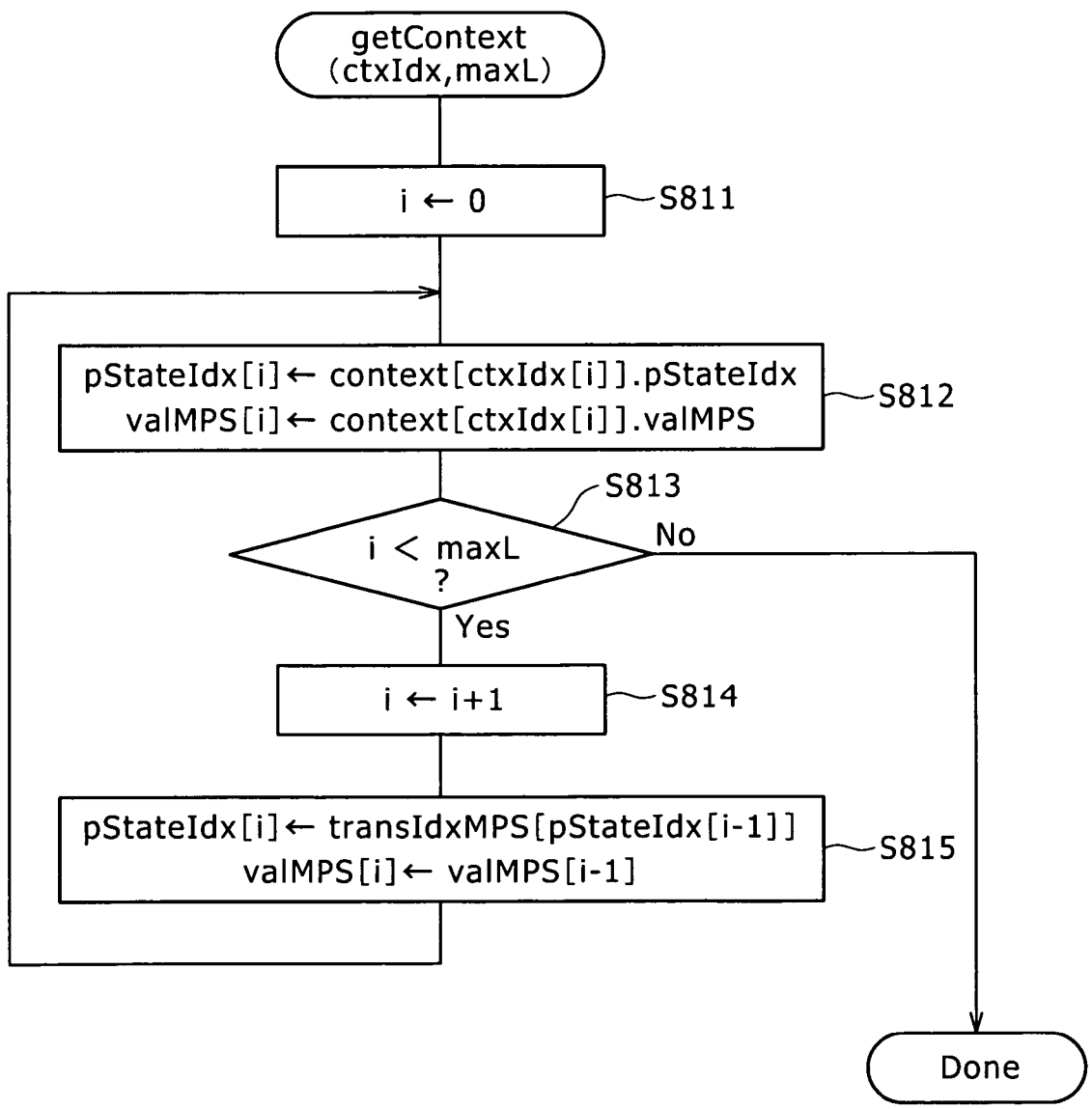
FIG. 4 illustrates another exemplary procedure for the process (step S810) of acquiring the context variable (in the case where each ctxIdx is identical) according to an embodiment of the present invention.

FIGS. 3 and 4 illustrate an exemplary procedure for the process of acquiring the context variable (step S810) according to this embodiment of the present invention. As described above, the method of acquiring the context variable varies depending on whether ctxIdx remains the same all the time or whether ctxIdx is different each time.

In the case where ctxIdx is different each time, the context variables can be acquired separately as illustrated in FIG. 3. Specifically, a variable i is set to "0" (step S811), and thereafter, the context variable is acquired based on ctxIdx[i] (step S812), which is different each time, while the variable i is incremented by "1" repeatedly (step S814), until the variable i reaches maxL (step S813).

Meanwhile, in the case where ctxIdx remains the same all the time, based on the top context variable, the subsequent context variables are acquired as illustrated in FIG. 4. Specifically, the variable i is set to "0" (step S811), and thereafter, the context variable is acquired based on ctxIdx[i] (step S812), and while the variable i is less than maxL (step S813), the variable i is incremented by "1" repeatedly (step S814). Then, pStateIdx[i] is acquired from transIdxMPS[pStateIdx [i−1]] as illustrated in FIG. 28, and valMPS[i] is acquired from valMPS[i−1] (step S815).

Figure 5:
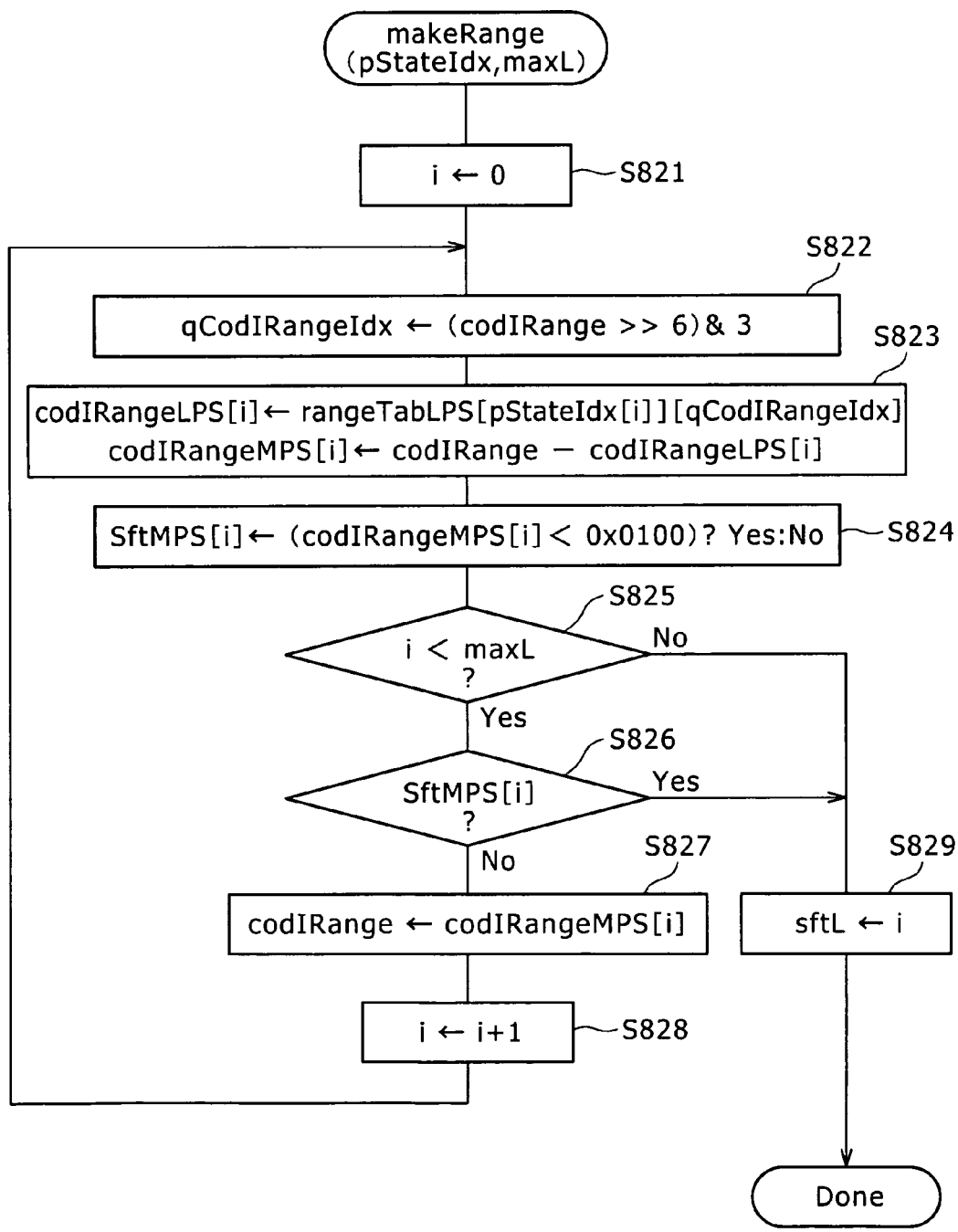
FIG. 5 illustrates an exemplary procedure for a range generation process (step S820) according to an embodiment of the present invention.

FIG. 5 illustrates an exemplary procedure for a range generation process (step S820) according to this embodiment of the present invention. In this range generation process (makeRange), codIRangeLPS, codIRangeMPS, SftMPS[i], and sftL are generated. Here, the variable i is set to "0" (step S821), and thereafter, until the variable i becomes equal to or greater than maxL (step S825) or SftMPS[i] becomes "Yes" (step S826), the following processes are repeated while the variable i is incremented by "1" repeatedly (step S828).

With the value of 7th and 6th bits of codIRange, codIRange [7:6], as qCodIRangeIdx (step S822), codIRangeLPS[i] is determined by referring to a table rangeTabLPS[pStateIdx[i]] [qCodIRangeIdx] as illustrated in FIG. 27 (step S823). Meanwhile, codIRangeMPS[i] is obtained by subtracting codIRangeLPS[i] from codIRange (step S823). In addition, the flag SftMPS[i] is set to store "Yes" when codIRangeMPS [i]<0x100, and to store "No" when codIRangeMPS[i]>= 0x100.

If the variable i is less than maxL (step S825) and SftMPS [i] stores "No," codIRangeMPS[i] is set in codIRange (step S827). Thereafter, the variable i is incremented by "1" (step S828).

If the variable i becomes equal to or greater than maxL (step S825) or SftMPS[i] stores "Yes," the variable at the time is set in sftL (step S829).

Figure 6:
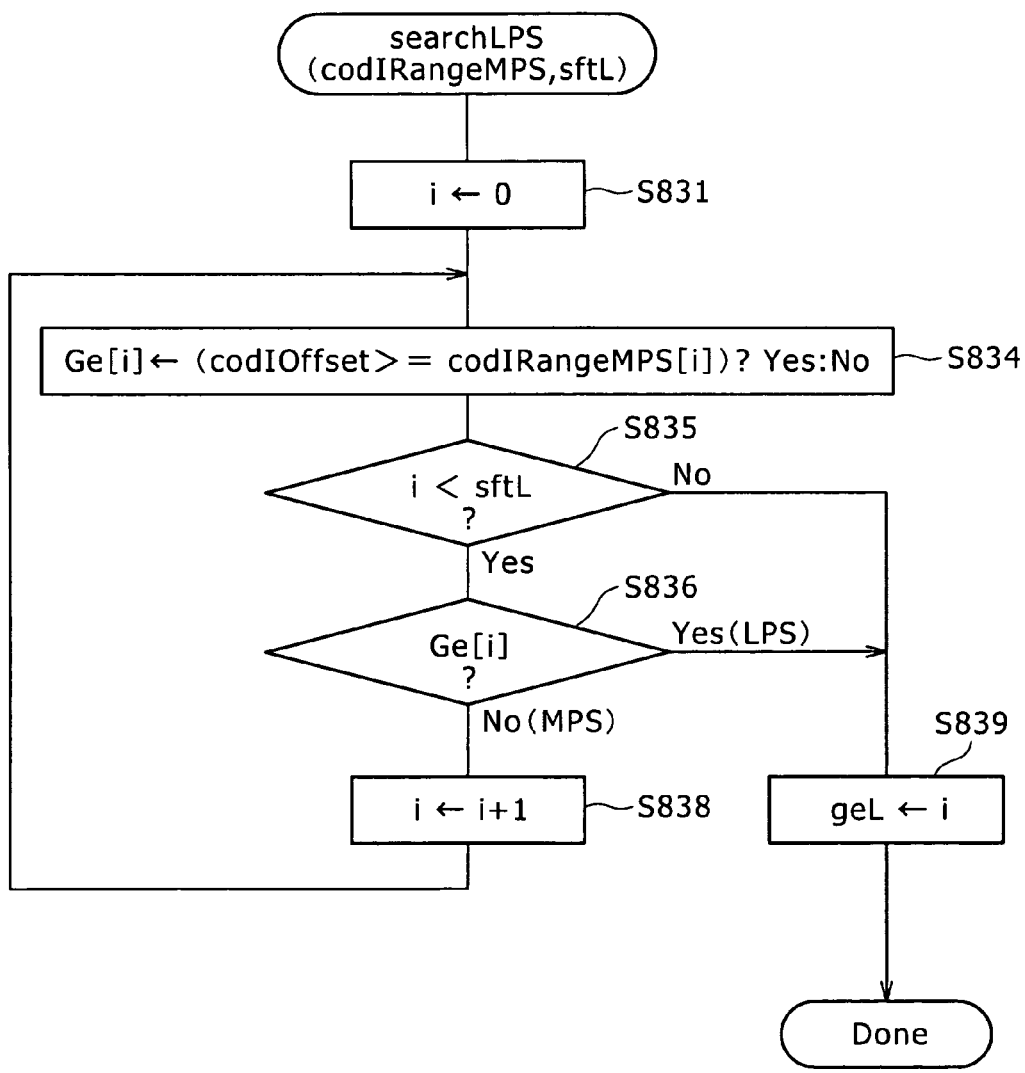
FIG. 6 illustrates an exemplary procedure for an LPS search process (step S830) according to an embodiment of the present invention.

FIG. 6 illustrates an exemplary procedure for an LPS search process (step S830) according to this embodiment of the present invention. In the LPS search process (searchLPS), the flag Ge[i] and geL are generated. Here, the variable i is set to "0" (step S831), and thereafter, until the variable i becomes equal to or greater than sftL (step S835) or Ge[i] becomes "Yes" (step S836), the following processes are repeated while the variable i is incremented by "1" repeatedly (step S838).

The flag Ge[i] is set to store "Yes" when codIOffset >= codIRangeMPS[i], and "No" when codIOffset<codIRangeMPS[i] (step S834).

If the variable i becomes equal to or greater than sftL (step S835) or Ge[i] becomes "Yes," the variable i at the time is set in geL (step S839).

Figure 7:
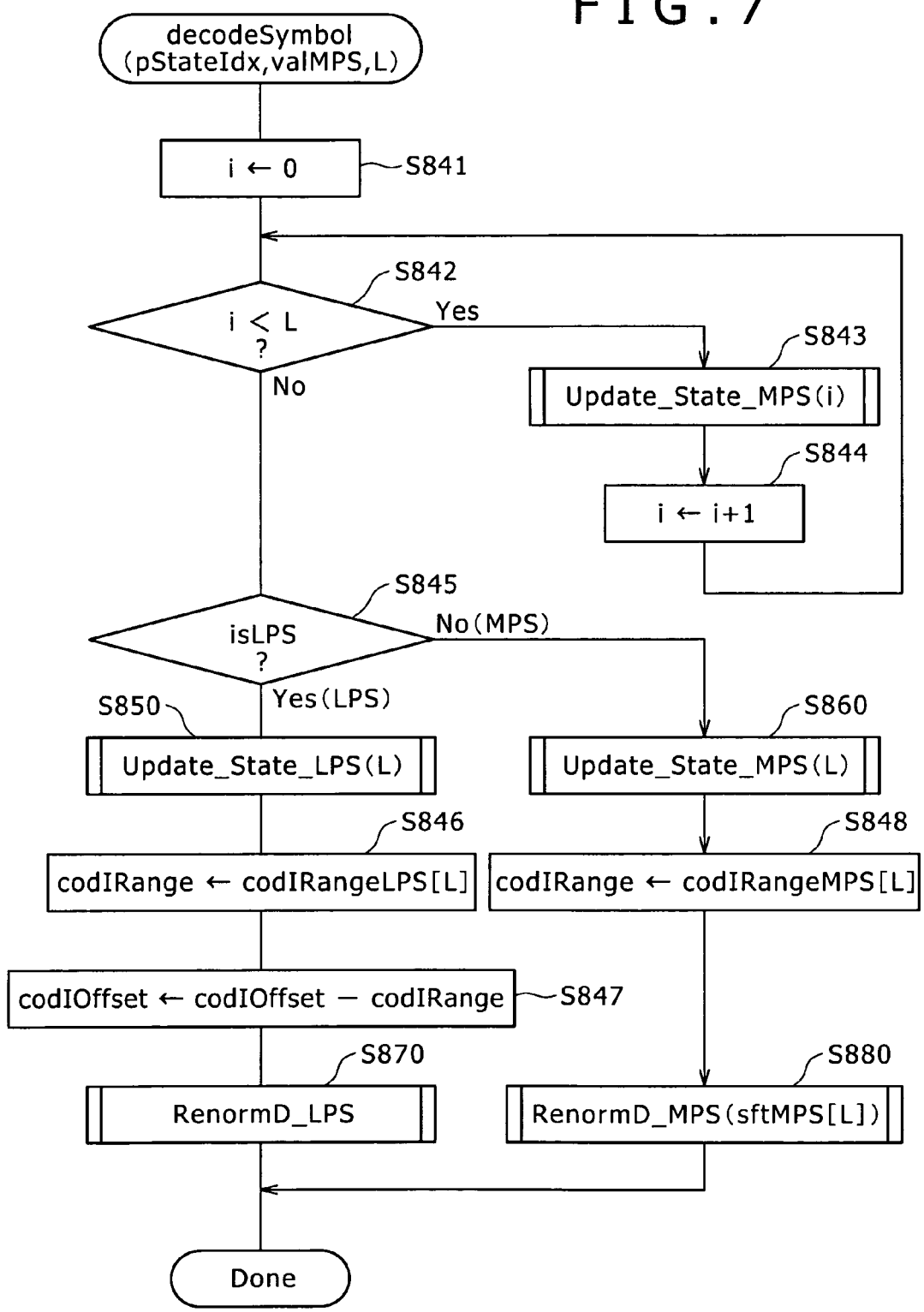
FIG. 7 illustrates an exemplary procedure for a process (step S840) of updating the context variable and internal state variables (in the case where each ctxIdx is different from the other) according to an embodiment of the present invention.
Figure 8:
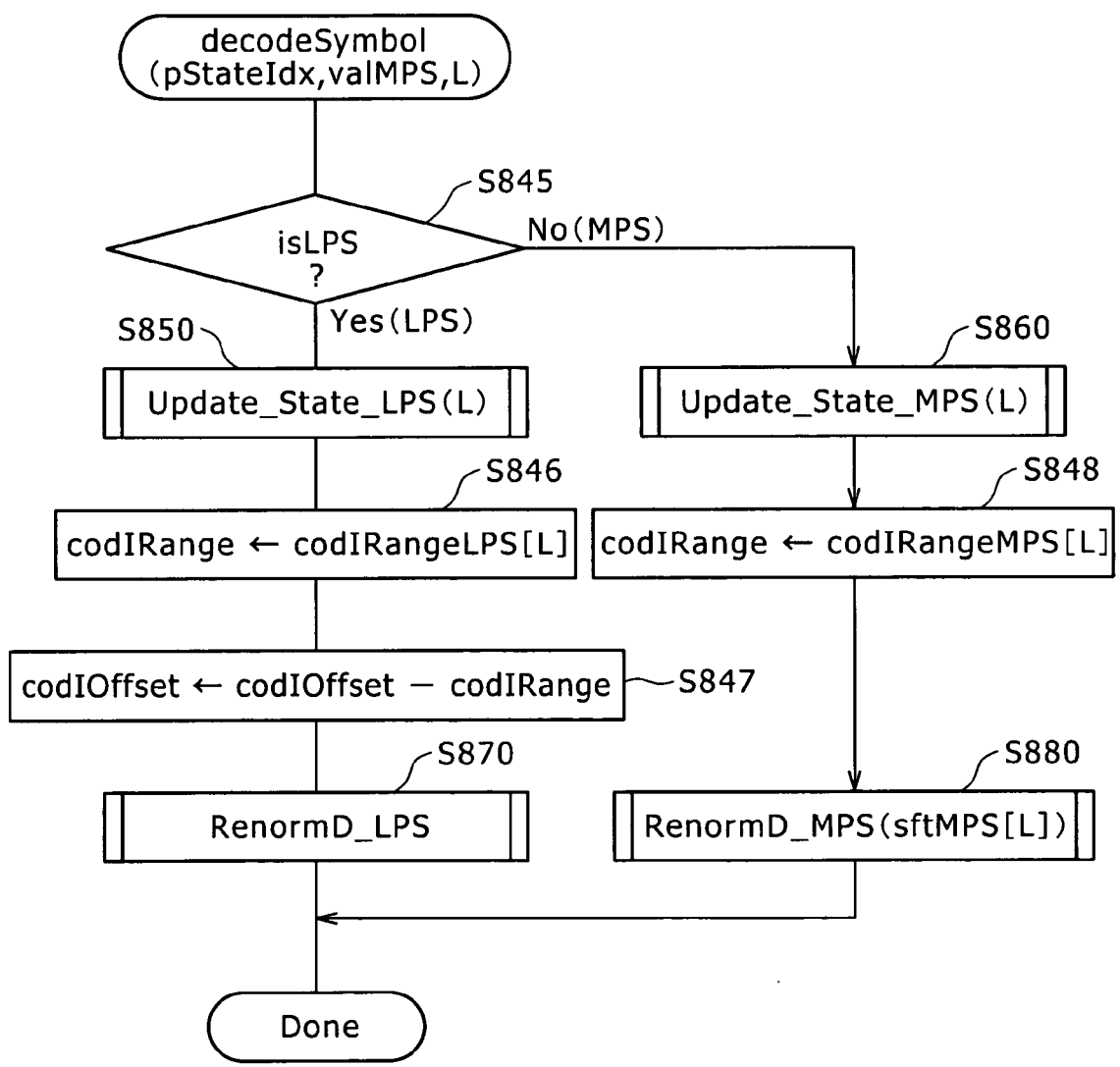
FIG. 8 illustrates another exemplary procedure for the process (step S840) of updating the context variable and the internal state variables (in the case where each ctxIdx is identical) according to an embodiment of the present invention.

FIGS. 7 and 8 illustrate an exemplary procedure for the process of updating the context variable and the internal state variables (step S840) according to this embodiment of the present invention. As described above, because the method of acquiring the context variable varies depending on whether ctxIdx remains the same all the time or whether ctxIdx is different each time, the process of updating the context variable also varies accordingly.

In the case where ctxIdx is different each time, update of L−1 symbols is performed first, as illustrated in FIG. 7. Specifically, the variable i is set to "0" (step S841), and thereafter, the context variable is updated repeatedly on the assumption of the MPS (step S843) while the variable i is incremented by "1" repeatedly (step S844), until the variable i reaches L (step S842).

Thereafter, the following processes are performed in accordance with the value of is LPS, which has been set at step S804. If the value of is LPS is "Yes" (step S845), the Lth symbol is the LPS, and therefore, the context variable is updated on the assumption of the LPS (step S850), codIRangeLPS[L] is set in codIRange (step S846), and the value obtained by subtracting codIRange from codIOffset is set in codIOffset (step S847). In addition, the renormalization process is performed on the assumption of the LPS (step S870).

If the value of is LPS is "No" (step S845), the Lth symbol is the MPS, and therefore, the context variable is updated on the assumption of the MPS (step S860), and codIRangeMPS [L] is set in codIRange (step S848). In addition, the renormalization process is performed on the assumption of the MPS (step S880).

Meanwhile, in the case where ctxIdx remains the same all the time, the processes are performed in accordance with the value of is LPS, without the update of the L−1 symbols (steps S841 to S844 in FIG. 7) being performed, as illustrated in FIG. 8. The processes in this case are similar to those of step S845 and the subsequent steps in FIG. 7.

Figure 9:
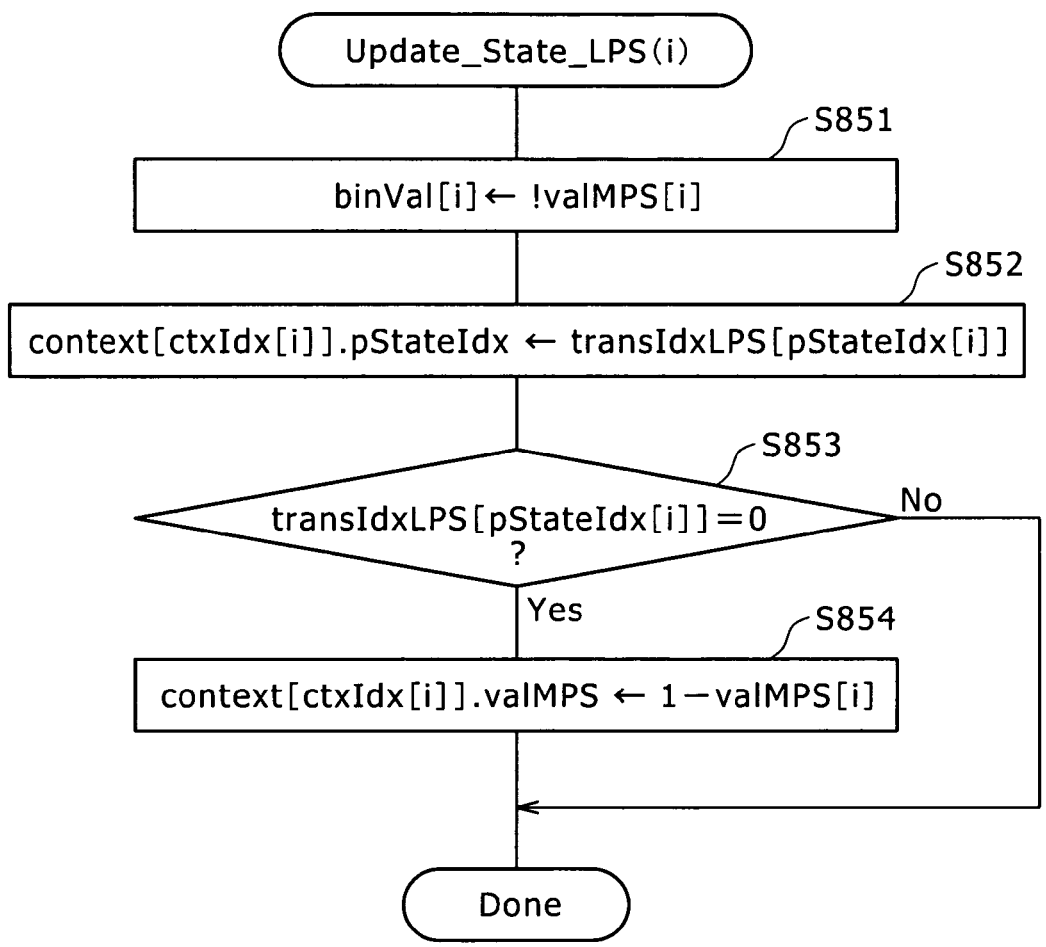
FIG. 9 illustrates an exemplary procedure for an update process (step S850) in the case of an LPS, according to an embodiment of the present invention.

FIG. 9 illustrates an exemplary procedure for the update process (step S850) in the case of the LPS according to this embodiment of the present invention. Here, on the assumption that the LPS has been decoded, the inverse value of valMPS[i] is set in binVal[i] (step S851). Then, context[ctxIdx[i]].pStateIdx is updated based on transIdxLPS[pStateIdx [i]] as illustrated in FIG. 28 (step S852). Then, if transIdxLPS [pStateIdx[i]] is "0" (step S853), context[ctxIdx[i]].valMPS is updated to have the inverse value of valMPS[i] (step S854).

Figure 10:
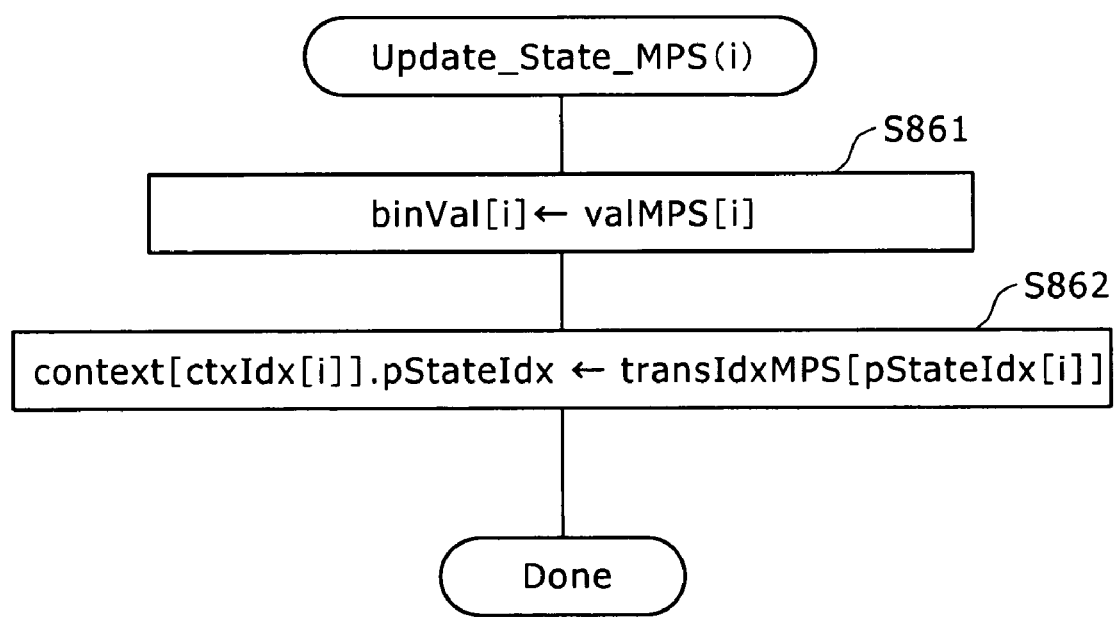
FIG. 10 illustrates an exemplary procedure for an update process (steps S843 and S860) in the case of an MPS, according to an embodiment of the present invention.

FIG. 10 illustrates an exemplary procedure for the update process (steps S843 and S860) in the case of the MPS according to this embodiment of the present invention. Here, on the assumption that the MPS has been decoded, the value of valMPS[i] is set in binVal[i] (step S861). Then, context[ctxIdx[i]].pStateIdx is updated based on transIdxMPS[pStateIdx [i]] as illustrated in FIG. 28 (step S862).

Figure 11:
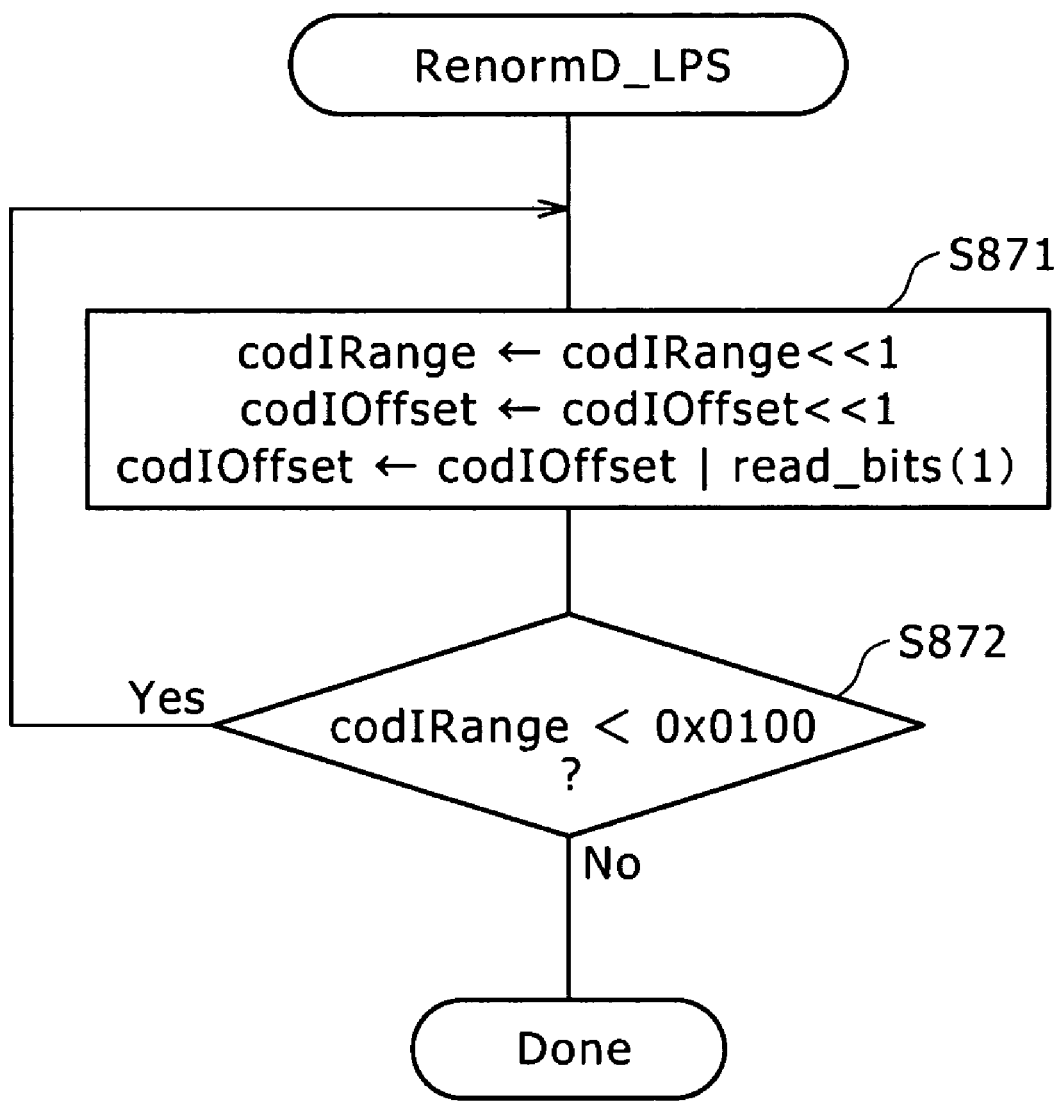
FIG. 11 illustrates an exemplary procedure for a renormalization process (step S870) in the case of the LPS, according to an embodiment of the present invention.

FIG. 11 illustrates an exemplary procedure for the renormalization process in the case of the LPS (step S870) according to this embodiment of the present invention. Here, codIRange and codIOffset are shifted to the left by one bit, while one bit of the encoded data is inputted from the stream into the LSB of codIOffset (step S871). These processes are repeated until codIRange becomes equal to or greater than 0x0100 (step S872).

Figure 12:
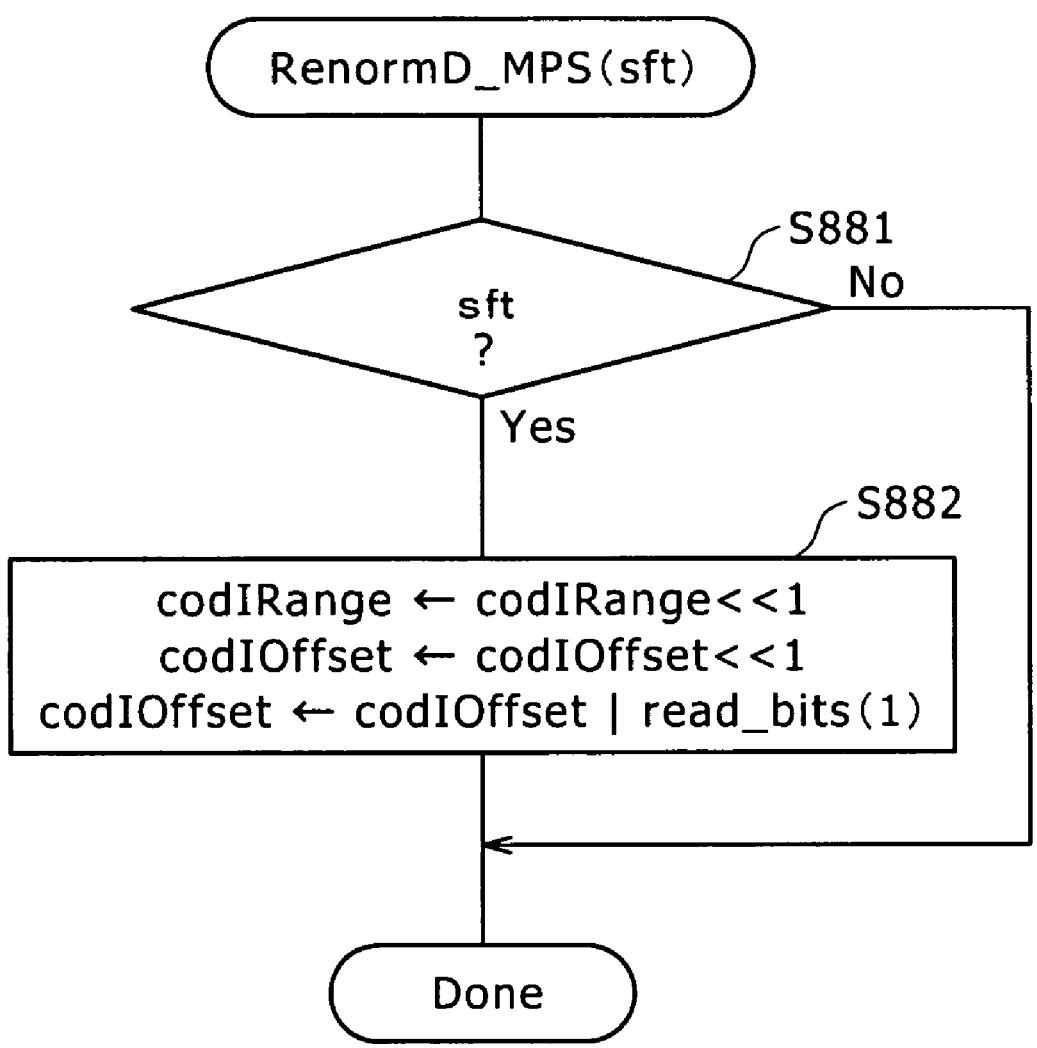
FIG. 12 illustrates an exemplary procedure for a renormalization process (step S880) in the case of the MPS, according to an embodiment of the present invention.

FIG. 12 illustrates an exemplary procedure for the renormalization process in the case of the MPS (step S880) according to this embodiment of the present invention. Here, on the assumption that sft is SftMPS[L] in step S880, if sft indicates "Yes," the following processes are performed (step S881). That is, codIRange and codIOffset are shifted to the left by one bit, while one bit of the encoded data is inputted from the stream into the LSB of codIOffset (step S882).

Figure 13:
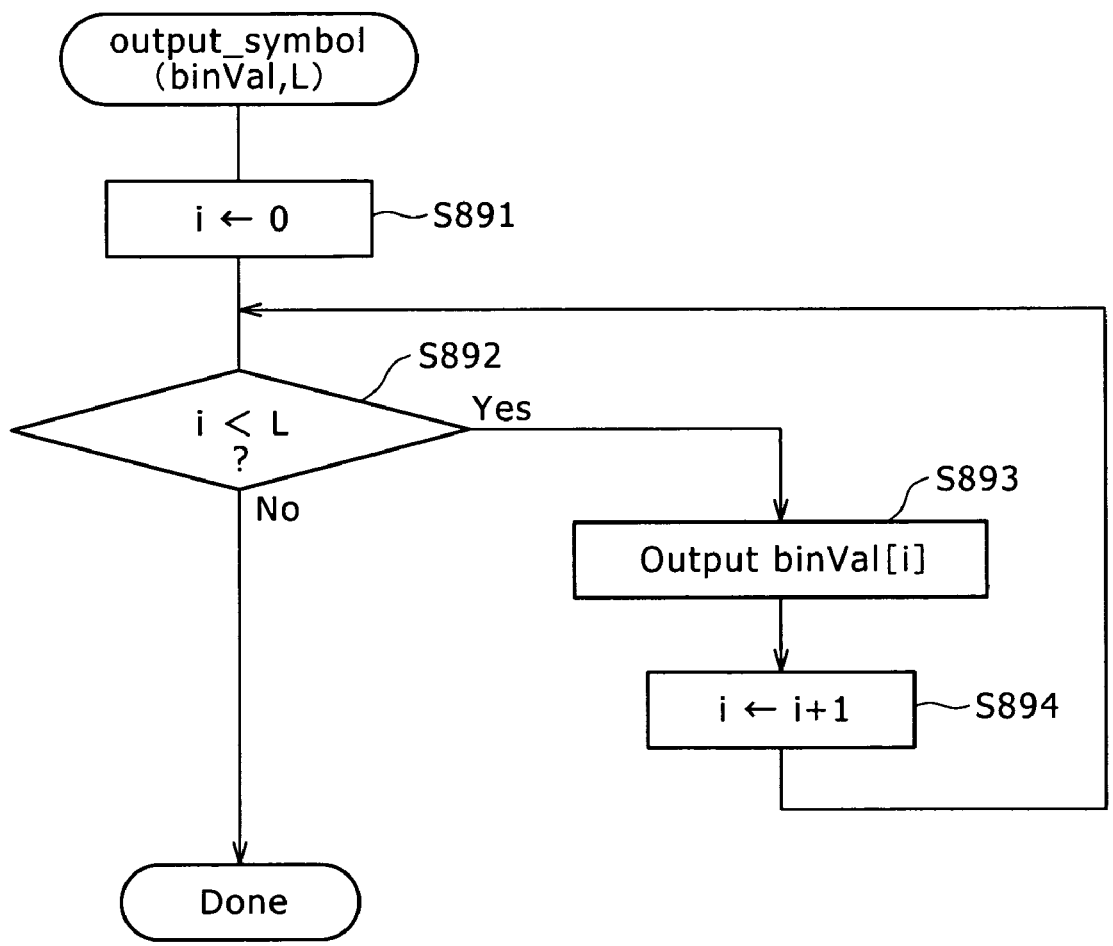
FIG. 13 illustrates an exemplary procedure for a symbol output process (step S890) according to an embodiment of the present invention.

FIG. 13 illustrates an exemplary procedure for a symbol output process (step S890) according to this embodiment of the present invention. Here, the variable i is set to "0" (step S891), and thereafter, binVal[i] is outputted (step S893) repeatedly while the variable i is incremented by "1" repeatedly (step S894), until the variable i reaches L (step S892).

Figure 14:
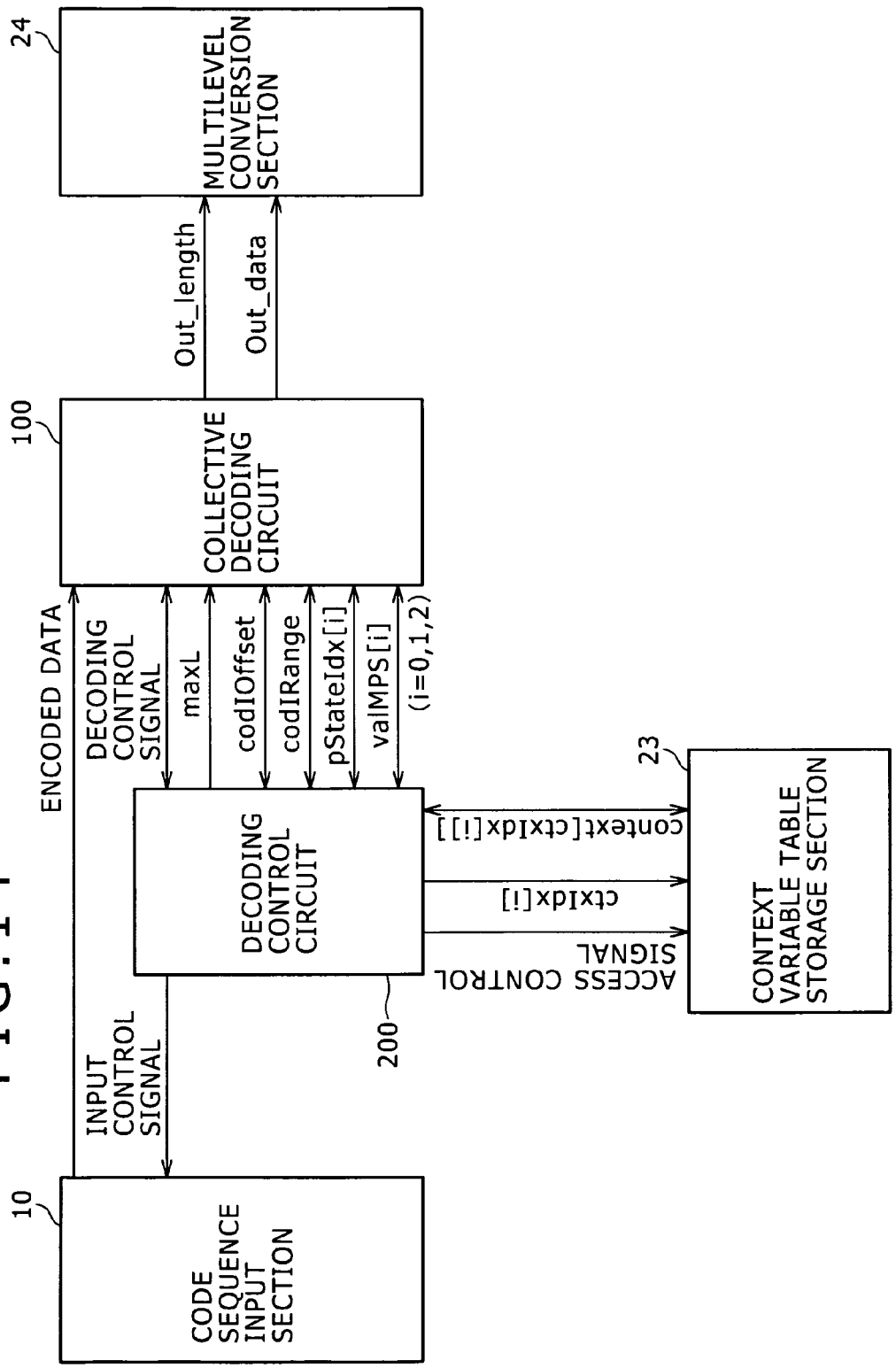
FIG. 14 illustrates an exemplary structure of a CABAC decoder according to an embodiment of the present invention.

FIG. 14 illustrates an exemplary structure of the CABAC decoder according to this embodiment of the present invention. The CABAC decoder includes a collective decoding circuit 100, a decoding control circuit 200, the context variable table storage section 23, and the multilevel conversion section 24.

The context variable table storage section 23 stores the context variable table, which contains the context variables that can be identified by the context index ctxIdx[i]. The context variable table storage section 23 stores, as the context variables, the probability state index context[ctxIdx[i]]. pStateIdx and the MPS value context[ctxIdx[i]].valMPS. The context index ctxIdx[i], which is used to identify the context variable, is supplied from the decoding control circuit 200. The context variable is read from the decoding control circuit 200 and updated. An access control signal, which is used for control over access to the context variable table, is also supplied from the decoding control circuit 200.

The collective decoding circuit 100 performs the collective decoding on the encoded data inputted from the code sequence input section 10. The context variable (i.e., pStateIdx[i] and valMPS), the internal state variables (i.e., codIOffset and codIRange), and maxL are supplied from the decoding control circuit 200 to the collective decoding circuit 100. In addition, the collective decoding circuit 100 updates the context variable and the internal state variables for the decoding control circuit 200. As the decoding result obtained by the collective decoding circuit 100, Out_data and Out_length are outputted to the multilevel conversion section 24. Here, Out_data is a sequence of decoded symbols starting with the LSB, whereas Out_length represents a value that is one less than the number of symbols that have been decoded collectively. Note that a decoding control signal, which is a control signal necessary for this decoding, is exchanged between the collective decoding circuit 100 and the decoding control circuit 200.

The decoding control circuit 200 controls the decoding process performed in the collective decoding circuit 100. The decoding control circuit 200 controls the collective decoding circuit 100 to perform the decoding process repeatedly until decoding of data of a specified length dL is completed. For example, in a first instance of the decoding, L symbols are decoded by decoding them while maxL is set to 6 if dL is equal to or greater than 6, or set to dL if dL is less than 6. In second and subsequent instances of the decoding, the setting is made such that a symbol next to the symbols that have already been decoded will correspond to variable i=0, and pStateIdx[i] and valMPS[i] are set accordingly. At this time, maxL is set to 6 if a difference between the number of symbols that have already been decoded and dL is greater than 6, whereas maxL is set to the difference between the two if the difference is not greater than 6. In this manner, the decoding is repeated until the decoding of all the dL symbols is completed. The decoding control circuit 200 stores the internal state variables (i.e., codIOffset and codIRange), and updates the internal state variables based on an instruction from the collective decoding circuit 100. Also, the decoding control circuit 200 outputs an input control signal, which is necessary for control over the input of the encoded data from the code sequence input section 10, to the code sequence input section 10.

The multilevel conversion section 24 converts the binary signal Out_data, which is outputted from the collective decoding circuit 100, to the original multilevel signal.

Figure 15:
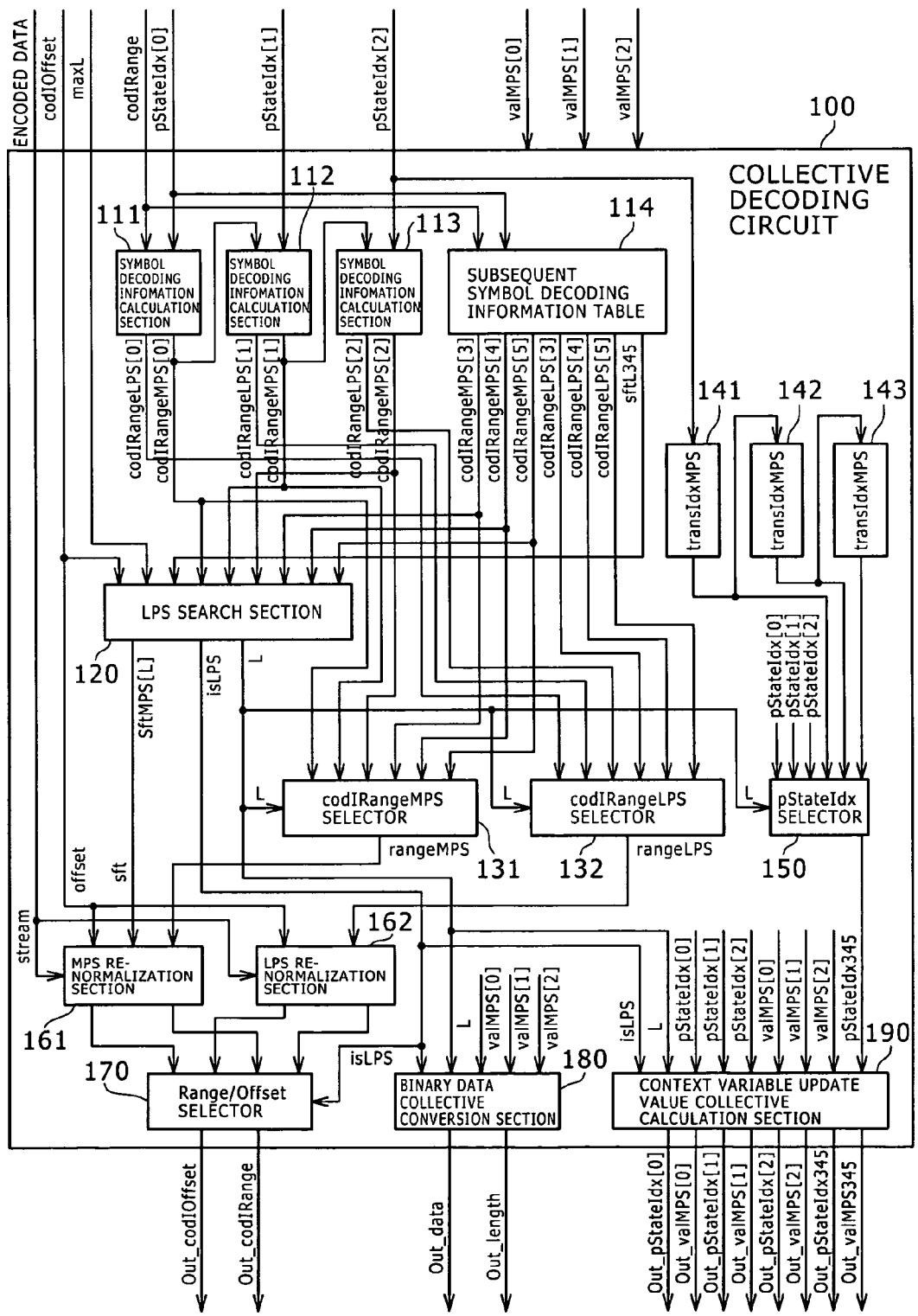
FIG. 15 illustrates an exemplary structure of a collective decoding circuit 100 according to an embodiment of the present invention.

FIG. 15 illustrates an exemplary structure of the decoding control circuit 100 according to this embodiment of the present invention. The collective decoding circuit 100 calculates up to the first three symbols with computing units that are cascaded with one another, and calculates the next three symbols, i.e., the fourth, the fifth, and the sixth symbols, by referring to the table. In the case where each ctxIdx[i] is different from each other, maxL is set to 3 or less, and a different value is set in each of pStateIdx[i] and valMPS[i] (i=0, 1, and 2). Meanwhile, in the case where each ctxIdx[i] is identical, maxL is set to 6 or less, and based on the values of one context variable, pStateIdx[0] and valMPS[0], the subsequent values are set as follows:

pStateIdx [1]=transIdxMPS[pStateIdx[0]]
valMPS[1]=valMPS[0]
pStateIdx[2]=transIdxMPS[pStateIdx[1]]
valMPS[2]=valMPS[0]

The collective decoding circuit 100 includes: symbol decoding information calculation sections 111, 112, and 113; a subsequent symbol decoding information table 114; an LPS search section 120; a codIRangeMPS selector 131; a codIRangeLPS selector 132; pStateIdx conversion sections 141, 142, and 143; a pStateIdx selector 150; an MPS renormalization section 161; an LPS renormalization section 162; a Range/Offset selector 170; a binary data collective conversion section 180; and a context variable update value collective calculation section 190.

The symbol decoding information calculation sections 111 to 113 are the computing units that are cascaded with one another, and acquire codIRangeLPS[0-2] and codIRangeMPS[0-2] as symbol decoding information. The symbol decoding information codIRangeLPS[0-2] and codIRangeMPS[0-2] can be calculated by Eqs. 7 to 12 mentioned above.

The subsequent symbol decoding information table 114 acquires codIRangeLPS[3-5], codIRangeMPS[3-5], and sftL345, as symbol decoding information. Unlike the symbol decoding information calculation sections 111 to 113, the subsequent symbol decoding information table 114 is not computing units that are cascaded with one another, but a table that is to be referred to with codIRange and pStateIdx [0].

Based on codIOffset and maxL, which are supplied from the decoding control circuit 200, and codIRangeLPS[0-5], codIRangeMPS[0-5], and sftL345, which are supplied from the symbol decoding information calculation sections 111 to 113 or the subsequent symbol decoding information table 114, the LPS search section 120 generates the number L of symbols that can be decoded collectively, isLPS, which indicates whether the Lth symbol is the LPS, and the flag SftMPS [L] for the Lth symbol.

In accordance with the number L of symbols that can be decoded collectively, which is outputted from the LPS search section 120, the codIRangeMPS selector 131 selects one of codIRangeMPS[0-5] as rangeMPS. In accordance with the number L of symbols that can be decoded collectively, which is outputted from the LPS search section 120, the codIRangeLPS selector 132 selects one of codIRangeLPS[0-5] as rangeLPS.

The pStateIdx conversion sections 141 to 143 convert pStateIdx so as to satisfy the transition table transIdxMPS as illustrated in FIG. 28.

In accordance with the number L of symbols that can be decoded collectively, which is outputted from the LPS search section 120, the pStateIdx selector 150 selects, as pStateIdx345, one of pStateIdx[0-2], which are supplied from the decoding control circuit 200, and pStateIdx[3-5], which are supplied from the pStateIdx conversion sections 141 to 143.

The MPS renormalization section 161 performs the renormalization process on the assumption that the decoded symbol is the MPS. The LPS renormalization section 162 performs the renormalization process on the assumption that the decoded symbol is the LPS. In accordance with isLPS, which is supplied from the LPS search section 120, the Range/Offset selector 170 selects codIRange and codIOffset renormalized in either the MPS renormalization section 161 or the LPS renormalization section 162.

The binary data collective conversion section 180 performs binary data collective conversion based on valMPS[0-2]. The binary data collective conversion section 180 outputs Out_data and Out_length.

The context variable update value collective calculation section 190 calculates values that are used to update the context variables collectively. More specifically, the context variable update value collective calculation section 190 supplies output values of pStateIdx[0-2], valMPS[0-2], pStateIdx345, and valMPS345 to the decoding control circuit 200.

The reading of the context variables is performed by the decoding control circuit 200, so that values are set in pStateIdx[i] and valMPS[i] (i=0, 1, and 2). In the case where each context index is different from the other, if the maximum number of symbols that can be decoded at a time is 1 or 2, a certain number is set in maxL, and unnecessary pStateIdx[i] and valMPS[i] are thus ignored. Therefore, an arbitrary value may be set in unused pStateIdx[i] and valMPS[i].

The update of the context variables is also performed via the decoding control circuit 200. The decoding control circuit 200 recognizes whether each context index is identical or whether each context index is different from the other. In the case where each context index is identical, Out_pStateIdx345 and Out_valMPS345 are determined to be update values. In the case where each context index is different from the other, only pStateIdx[i] and valMPS[i] (i=0, . . . , Out_length) are determined to be update values. Here, Out_length represents the value that is one less than the number of symbols that have been decoded collectively, and Out_data is the sequence of the decoded symbols starting with the LSB.

Figure 16:
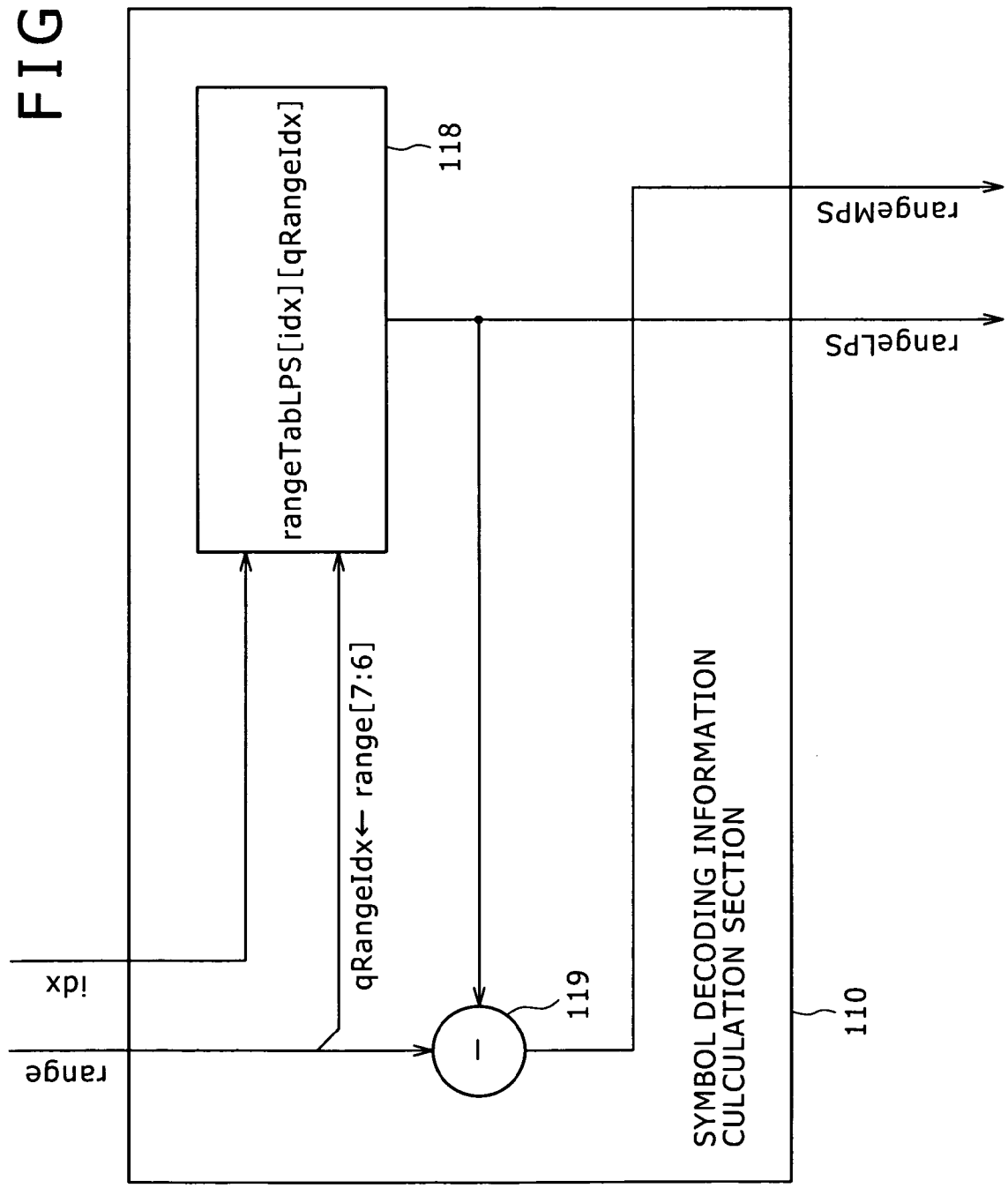
FIG. 16 illustrates an exemplary structure of a symbol decoding information calculation section 110 according to an embodiment of the present invention.

FIG. 16 illustrates an exemplary structure of a symbol decoding information calculation section 110 according to this embodiment of the present invention. The symbol decoding information calculation section 110 represents each of the symbol decoding information calculation sections 111 to 113. Note, however, that, in the case of the symbol decoding information calculation section 111, range, idx, rangeLPS, and rangeMPS should be replaced with codIRange, pStateIdx [0], codIRangeLPS[0], and codIRangeMPS[0], respectively. Also, in the case of the symbol decoding information calculation section 112, range, idx, rangeLPS, and rangeMPS should be replaced with codIRangeMPS[0], pStateIdx[1], codIRangeLPS[1], and codIRangeMPS[1], respectively. Also, in the case of the symbol decoding information calculation section 113, range, idx, rangeLPS, and rangeMPS should be replaced with codIRangeMPS[1], pStateIdx[2], codIRangeLPS[2], and codIRangeMPS[2], respectively.

The symbol decoding information calculation section 110 includes a table 118 and a subtractor 119. The table 118 corresponds to the rangeTabLPS table as illustrated in FIG. 27, and outputs rangeTabLPS[idx][qRangeIdx] as rangeLPS. Here, qRangeIdx represents the value of the 7th and 6th bits of range. The subtractor 119 outputs, as rangeMPS, a value obtained by subtracting rangeLPS from range.

Figure 17:
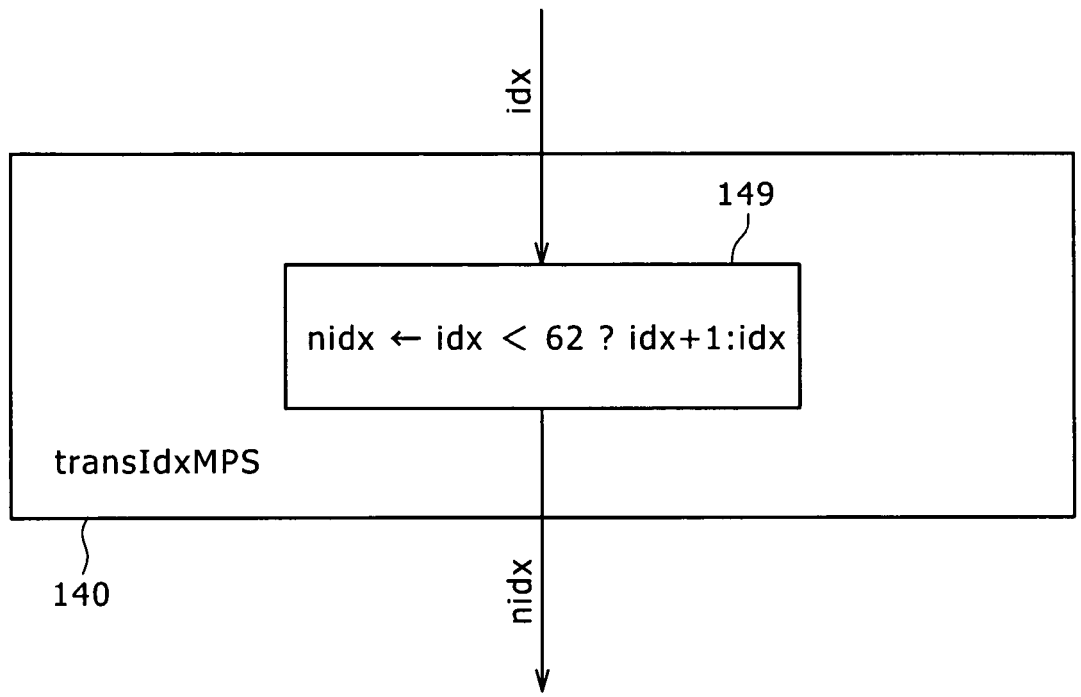
FIG. 17 illustrates an exemplary structure of a pStateIdx conversion section 140 according to an embodiment of the present invention.

FIG. 17 illustrates an exemplary structure of a pStateIdx conversion section 140 according to this embodiment of the present invention. The pStateIdx conversion section 140 represents each of the pStateIdx conversion sections 141 to 143. Note, however, that in the case of the pStateIdx conversion section 141, idx and nidx should be replaced with pStateIdx [2] and pStateIdx[3], respectively. Also, in the case of the pStateIdx conversion section 142, idx and nidx should be replaced with pStateIdx[3] and pStateIdx[4], respectively. Also, in the case of the pStateIdx conversion section 143, idx and nidx should be replaced with pStateIdx[4] and pStateIdx [5], respectively.

The pStateIdx conversion section 140 converts pStateIdx so as to satisfy the transition table transIdxMPS as illustrated in FIG. 28. If idx is less than "62," nidx is a value obtained by adding one to idx, whereas if idx is "62" or "63," nidx is equal to idx (149).

Figure 18:
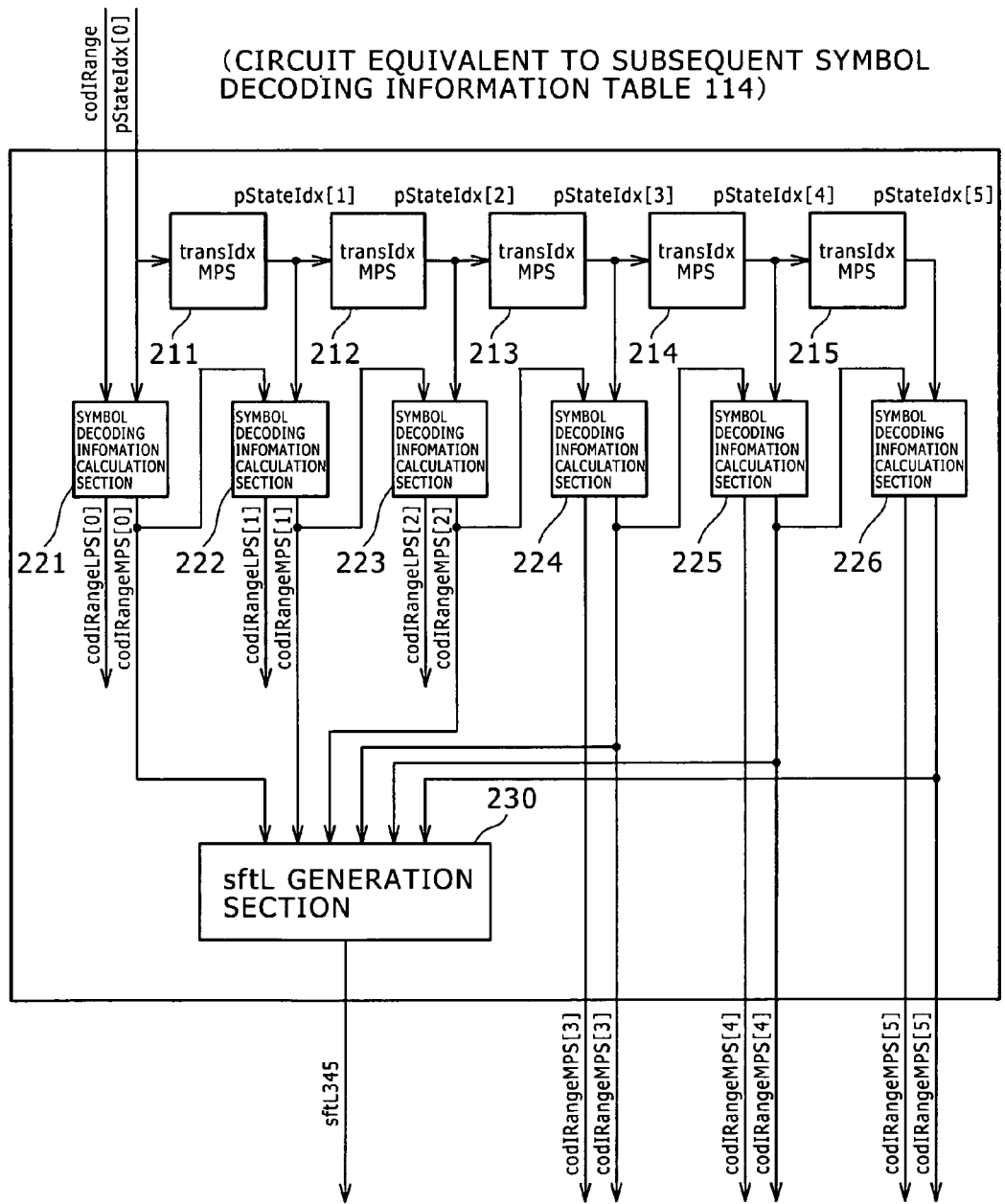
FIG. 18 illustrates an exemplary circuit that is equivalent to a subsequent symbol decoding information table 114 according to an embodiment of the present invention.

FIG. 18 illustrates an exemplary circuit that is equivalent to the subsequent symbol decoding information table 114 according to this embodiment of the present invention. As noted previously, the subsequent symbol decoding information table 114 is a table that is to be referred to with codIRange and pStateIdx[0], and in actuality, the subsequent symbol decoding information table 114 does not have a cascade structure as illustrated in FIG. 18. Here, the equivalent circuit is illustrated for the sake of explaining an operation of the subsequent symbol decoding information table 114.

In the circuit equivalent to the subsequent symbol decoding information table 114, each of pStateIdx conversion sections 211, 212, 213, 214, and 215 has a function similar to that of the pStateIdx conversion section 140 as described above with reference to FIG. 17, and converts pStateIdx so as to satisfy the transition table transIdxMPS as illustrated in FIG. 28. Each of symbol decoding information calculation sections 221, 222, 223, 224, 225, and 226 has a function similar to that of the symbol decoding information calculation section 110 as described above with reference to FIG. 16, and generates corresponding components of codIRangeLPS[0-5] and codIRangeMPS[0-5] based on the rangeTabLPS table as illustrated in FIG. 27. An sftL generation section 230 refers to codIRangeMPS[0-5], which are generated by the symbol decoding information calculation sections 221 to 226, sequentially, and outputs the number of the first one that is less than 0x0100 as sftL345.

Note that, concerning codIRangeLPS[i] and codIRangeMPS[i] where the variable i exceeds sftL, logic minimization may be performed, taking advantage of the fact that they are not used in circuits in the subsequent stages.

Figure 19:
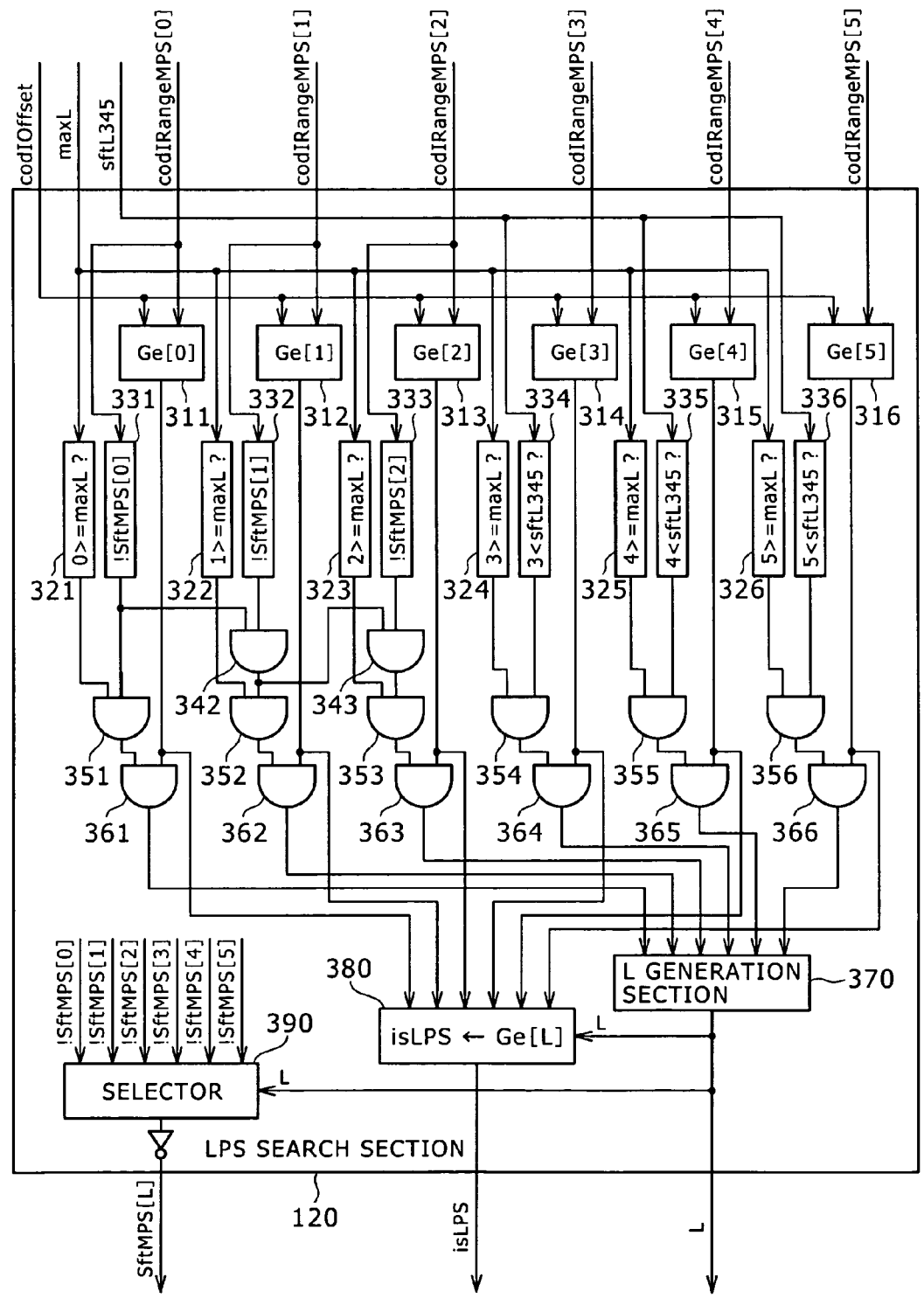
FIG. 19 illustrates an exemplary structure of an LPS search section 120 according to an embodiment of the present invention.

FIG. 19 illustrates an exemplary structure of the LPS search section 120 according to this embodiment of the present invention. The LPS search section 120 includes: Ge generation sections 311, 312, 313, 314, 315, and 316; maxL determination sections 321, 322, 323, 324, 325, and 326; SftMPS determination sections 331, 332, and 333; sftL determination sections 334, 335, and 336; AND circuits 342, 343, 351, 352, 353, 354, 355, 356, 361, 362, 363, 364, 365, and 366; an L generation section 370; an is LPS generation section 380; and a selector 390.

The Ge generation sections 311 to 316 compare codIOffset with codIRangeMPS[0-5] to generate Ge[0-5], respectively. When codIOffset >=codIRangeMPS[i], Ge[i] is set to a true value "1," whereas when codIOffset<codIRangeMPS[i], Ge[i] is set to a false value "0."

The maxL determination sections 321 to 326 determine whether or not maxL is equal to or less than "0," "1," "2," "3," "4," and "5," respectively. If maxL is equal to or less than their corresponding value, the true value "1" is outputted, whereas if maxL is not equal to or less than their corresponding value, the false value "0" is outputted.

The SftMPS determination sections 331 to 333 output the inverse values of SftMPS[0-2], respectively. If codIRangeMPS[i] is equal to or greater than 0x0100, SftMPS [i] is set to the true value "1." In other words, the SftMPS determination sections 331 to 333 output the true value "1" if codIRangeMPS[0-2] is less than 0x0100, and the false value "0" if codIRangeMPS[0-2] is not less than 0x0100.

The sftL determination sections 334 to 336 determine whether or not sftL345 exceeds "3," "4," and "5," respectively. Specifically, the sftL determination sections 334 to 336 output the true value "1" if sftL345 exceeds their corresponding value, and output the false value "0" if sftL345 does not exceed their corresponding value.

The AND circuit 342 calculates a logical product of the inverse value of SftMPS[0] and the inverse value of SftMPS

[1]. The AND circuit 343 calculates a logical product of an output from the AND circuit 342 and the inverse value of SftMPS[2]. Thus, to right inputs of the AND circuits 351 to 356, "1" is inputted up to a position indicated by sftL, and "0" is inputted thereafter. Meanwhile, to left inputs of the AND circuits 351 to 356, "1" is inputted up to a position indicated by maxL, and "0" is inputted thereafter. Therefore, as outputs from the AND circuits 351 to 356, "1" is outputted up to a position indicated by the smaller one of the values of maxL and sftL, and "0" is outputted thereafter.

The outputs from the AND circuits 351 to 356 and the outputs from the Ge generation sections 311 to 316 are inputted to the AND circuits 361 to 366. Therefore, as outputs from the AND circuits 361 to 366, "1" is outputted up to a position indicated by the smallest of the values of maxL, sftL, and geL, and "0" is outputted thereafter.

The L generation section 370 generates the symbol length L based on the outputs from the AND circuits 361 to 366. Specifically, the L generation section 370 refers to the outputs from the AND circuits 361 to 366 sequentially, and outputs the number of the first output that is "0" as L. Note that in the case where all the outputs are "1," "6" is outputted as L.

The is LPS generation section 380 generates is LPS, which indicates whether or not the Lth symbol is the LPS. Specifically, the is LPS generation section 380 sets is LPS to Ge[L].

The selector 390 selects SftMPS[L], which indicates whether a shift occurs for the Lth symbol, referring to the outputs from the SftMPS determination sections 331 to 333 and the sftL determination sections 334 to 336.

Note that, in the case where each context index is different from the other, maxL is set to "3" or less, and the subsequent symbol decoding information table 114 is not referred to, and therefore, the same circuitry can be used as when each context index is identical.

Figure 20:
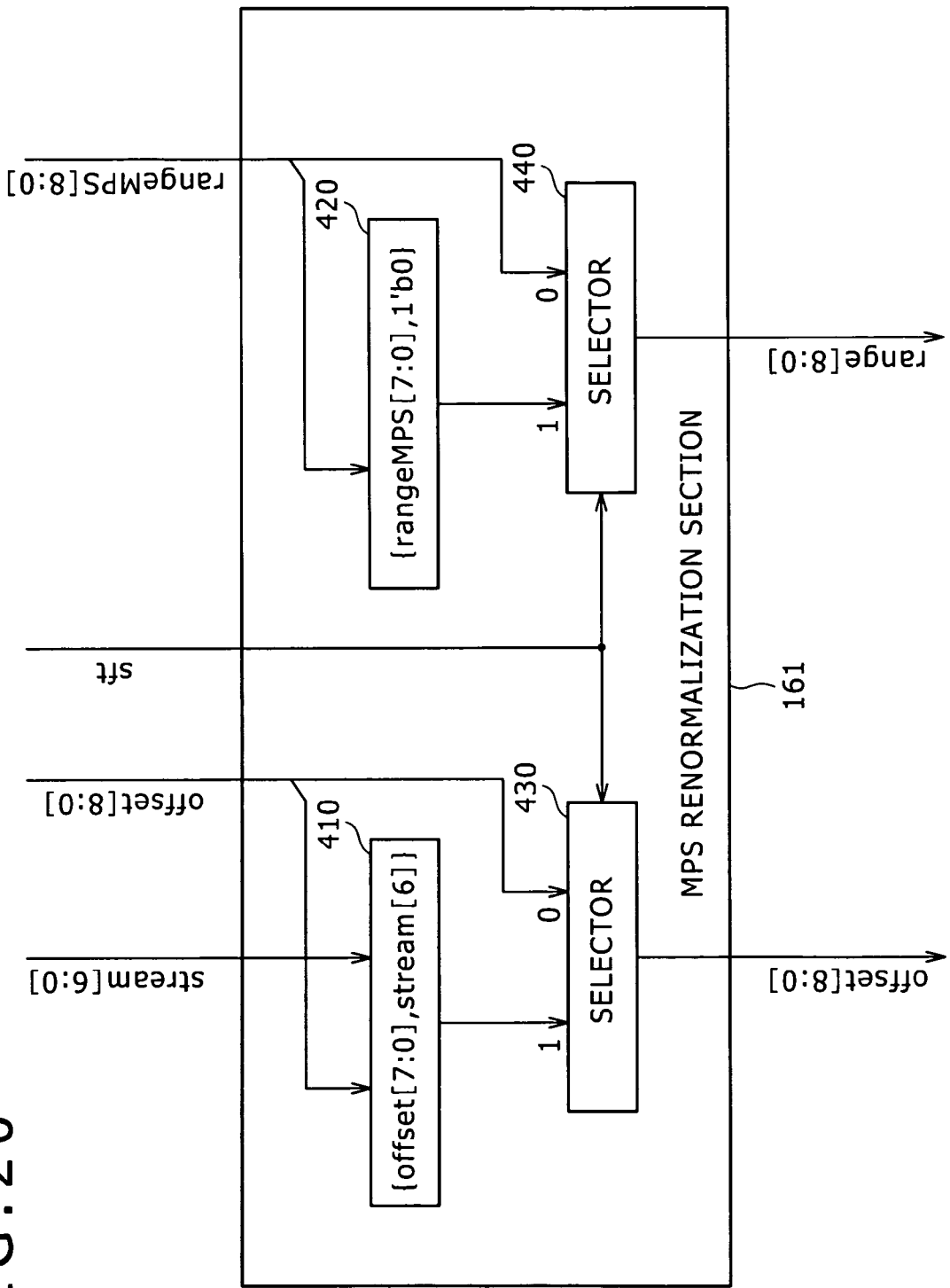
FIG. 20 illustrates an exemplary structure of an MPS renormalization section 161 according to an embodiment of the present invention.

FIG. 20 illustrates an exemplary structure of the MPS renormalization section 161 according to this embodiment of the present invention. The MPS renormalization section 161 includes selectors 430 and 440. The selector 430 is used to renormalize offset, whereas the selector 440 is used to renormalize range.

To a right input of the selector 430, offset, which is 9 bits long, is inputted. To a left input of the selector 430, as shown in 410, a combination of the lowest-order 8 bits of offset and the highest-order bit of stream added to the LSB side thereof is inputted. If sft represents "0," offset is outputted as it is, whereas if sft represents "1," offset is shifted to the left and an encoded bit in the stream is inputted to the LSB side thereof.

Note that seven bits starting with a current bit in the stream that is being decoded are assigned to stream[6:0] sequentially, starting with an MSB (stream[6]).

To a right input of the selector 440, rangeMPS, which is 9 bits long, is inputted. To a left input of the selector 440, as shown in 420, a combination of the lowest-order 8 bits of rangeMPS and a bit "0" added to the LSB side thereof is inputted. If sft represents "0," rangeMPS is outputted as it is, whereas if sft represents "1," rangeMPS is shifted to the left and "0" is filled into the LSB side thereof.

Figure 21:
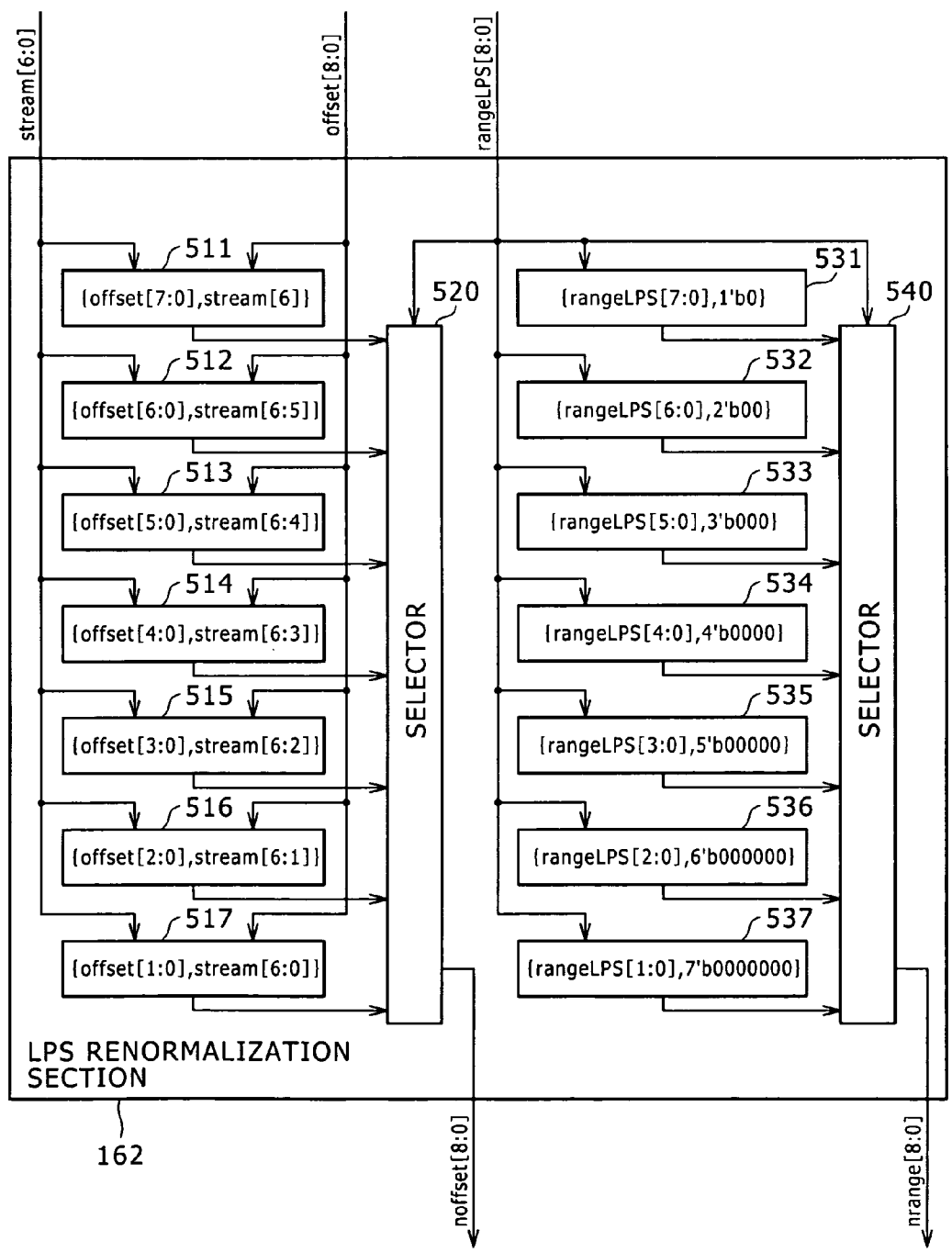
FIG. 21 illustrates an exemplary structure of an LPS renormalization section 162 according to an embodiment of the present invention.

FIG. 21 illustrates an exemplary structure of the LPS renormalization section 162 according to this embodiment of the present invention. The LPS renormalization section 162 includes selectors 520 and 540. The selector 520 is used to renormalize offset, whereas the selector 540 is used to renormalize range.

As shown in 511, 512, 513, 514, 515, 516, and 517, to the selector 520 are inputted pieces of data obtained by shifting offset, which is 9 bits long, to the left by 1, 2, 3, 4, 5, 6, and 7 bits, respectively, and filling an encoded bit(s) in the stream into the LSB side thereof. In the case where rangeLPS[7] is 1-bit "1," the data obtained by shifting offset to the left by 1 bit and filling one encoded bit into the LSB side thereof is selected. In the case where rangeLPS[7:6] is 2-bit "01," the data obtained by shifting offset to the left by 2 bits and filling two encoded bits into the LSB side thereof is selected. In the case where rangeLPS[7:5] is 3-bit "001," the data obtained by shifting offset to the left by 3 bits and filling three encoded bits into the LSB side thereof is selected. In the case where rangeLPS[7:4] is 4-bit "0001," the data obtained by shifting offset to the left by 4 bits and filling four encoded bits into the LSB side thereof is selected. In the case where rangeLPS[7:3] is 5-bit "00001," the data obtained by shifting offset to the left by 5 bits and filling five encoded bits into the LSB side thereof is selected. In the case where rangeLPS[7:2] is 6-bit "000001," the data obtained by shifting offset to the left by 6 bits and filling six encoded bits into the LSB side thereof is selected. In the case where rangeLPS[7:1] is 7-bit "0000001," the data obtained by shifting offset to the left by 7 bits and filling seven encoded bits into the LSB side thereof is selected.

As shown in 531, 532, 533, 534, 535, 536, and 537, to the selector 540 are inputted pieces of data obtained by shifting rangeLPS, which is 9 bits long, to the left by 1, 2, 3, 4, 5, 6, and 7 bits, respectively, and filling "0" into the LSB side thereof. In the case where rangeLPS[7] is 1-bit "1," the data obtained by shifting rangeLPS to the left by 1 bit and filling one bit of "0" to the LSB side thereof is selected. In the case where rangeLPS[7:6] is 2-bit "01," the data obtained by shifting rangeLPS to the left by 2 bits and filling two bits of "0" to the LSB side thereof is selected. In the case where rangeLPS[7:5] is 3-bit "001," the data obtained by shifting rangeLPS to the left by 3 bits and filling three bits of "0" to the LSB side thereof is selected. In the case where rangeLPS[7:4] is 4-bit "0001," the data obtained by shifting rangeLPS to the left by 4 bits and filling four bits of "0" to the LSB side thereof is selected. In the case where rangeLPS[7:3] is 5-bit "00001," the data obtained by shifting rangeLPS to the left by 5 bits and filling five bits of "0" to the LSB side thereof is selected. In the case where rangeLPS[7:2] is 6-bit "000001," the data obtained by shifting rangeLPS to the left by 6 bits and filling six bits of "0" to the LSB side thereof is selected. In the case where rangeLPS[7:1] is 7-bit "0000001," the data obtained by shifting rangeLPS to the left by 7 bits and filling seven bits of "0" to the LSB side thereof is selected.

Figure 22:
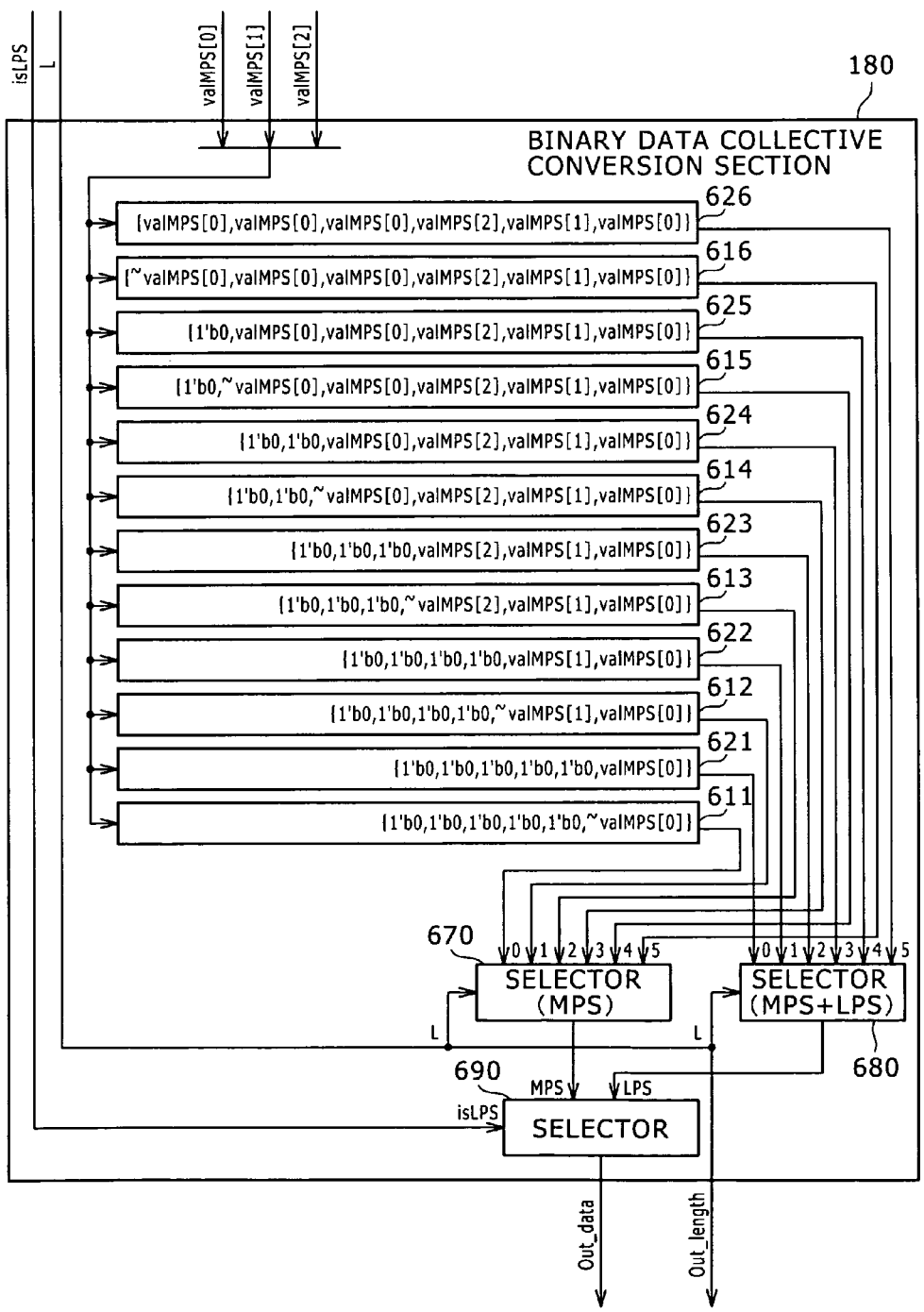
FIG. 22 illustrates an exemplary structure of a binary data collective conversion section 180 according to an embodiment of the present invention.

FIG. 22 illustrates an exemplary structure of the binary data collective conversion section 180 according to this embodiment of the present invention. The binary data collective conversion section 180 includes selectors 670, 680, and 690. The selector 670 is a selector used when all symbols are the MPS, whereas the selector 680 is a selector used when the symbols include the LPS. The selector 690 is a selector that selects either an output from the selector 670 or an output from the selector 680.

As shown in 611, 612, 613, 614, 615, and 616, to the selector 670 are inputted bit strings each composed of a combination of valMPS[0-2]. In the case where L is "0" a value composed of five bits of "0" and the inverse value of valMPS[0] added to the LSB side thereof is selected. In the case where L is "1," a value composed of four bits of "0" and the inverse value of valMPS[1] and valMPS[0] added to the LSB side thereof sequentially is selected. In the case where L is "2," a value composed of three bits of "0" and the inverse value of valMPS[2], valMPS[1], and valMPS[0] added to the LSB side thereof sequentially is selected. In the case where L is "3," a value composed of two bits of "0" and the inverse value of valMPS[0], valMPS[2], valMPS[1], and valMPS[0]

added to the LSB side thereof sequentially is selected. In the case where L is "4," a value composed of one bit of "0" and the inverse value of valMPS[0], valMPS[0], valMPS[2], valMPS [1], and valMPS[0] added to the LSB side thereof sequentially is selected. In the case where L is "5," a value composed of the inverse value of valMPS[0] and valMPS[0], valMPS [0], valMPS[2], valMPS[1], and valMPS[0] added to the LSB side thereof sequentially is selected.

Here, in the case where each context index is identical, it is assumed that valMPS[0] is set in valMPS[1], and that valMPS [0] is set in valMPS[2]. Inversion and update of valMPS[0] requires two continuous instances of the decoding of the LPS. This embodiment of the present invention considers only three cases: the case where all decoded symbols are the MPS; the case where continuous MPSs are followed by an LPS; and the case where only one LPS is decoded. Therefore, in this embodiment of the present invention, the update of valMPS [0] never occurs during the process.

Meanwhile, in the case where each context index is different from the other, each of valMPS[i] (i=0, 1, and 2) is set based on a different context, and a reference occurs only once. Therefore, the update of valMPS[i] need not be taken into consideration. Moreover, in this case, L is equal to or less than "2" as a result of setting maxL to "3" or less, the same circuitry can be used as in the case where each context index is identical.

As shown in 621, 622, 623, 624, 625, and 626, to the selector 680 are inputted bit strings each composed of a combination of valMPS[0-2]. In the case where L is "0," a value composed of five bits of "0" and valMPS[0] added to the LSB side thereof is selected. In the case where L is "1," a value composed of four bits of "0" and valMPS[1] and valMPS[0] added to the LSB side thereof sequentially is selected. In the case where L is "2," a value composed of three bits of "0" and valMPS[2], valMPS[1], and valMPS[0] added to the LSB side thereof sequentially is selected. In the case where L is "3," a value composed of two bits of "0" and valMPS[0], valMPS[2], valMPS[1], and valMPS[0] added to the LSB side thereof sequentially is selected. In the case where L is "4," a value composed of one bit of "0" and valMPS[0], valMPS[0], valMPS[2], valMPS[1], and valMPS [0] added to the LSB side thereof sequentially is selected. In the case where L is "5," a value composed of three valMPS [0]'s and valMPS[2], valMPS[1], and valMPS[0] added to the LSB side thereof sequentially is selected.

The selector 690 selects the output from the selector 680 if is LPS is "Yes," and selects the output from the selector 670 if is LPS is "No." The output from the selector 690 is outputted as Out_data, and L is outputted as Out_length. Once Out_data and Out_length are supplied to the multilevel conversion section 24, they are processed as (Out_length+1) binary signals, expressed as binVal[i]=Out_data[i] (i=0, . . . , Out_length). Note that Out_data is represented by Out_data[i] where the index i refers to the value of each bit, with i=0 referring to the LSB of Out_data.

Figure 23:
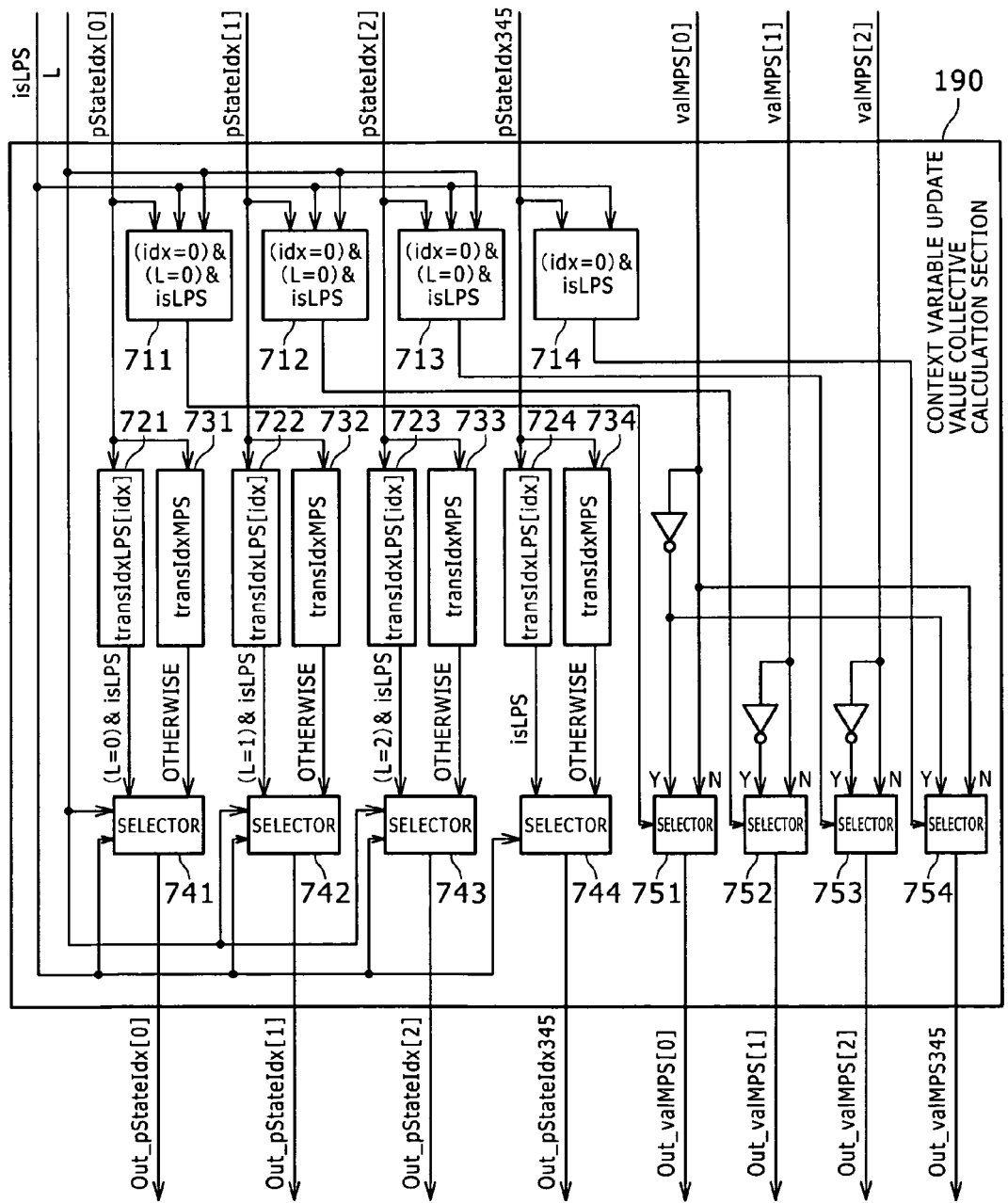
FIG. 23 illustrates an exemplary structure of a context variable update value collective calculation section 190 according to an embodiment of the present invention.
Figure 26:
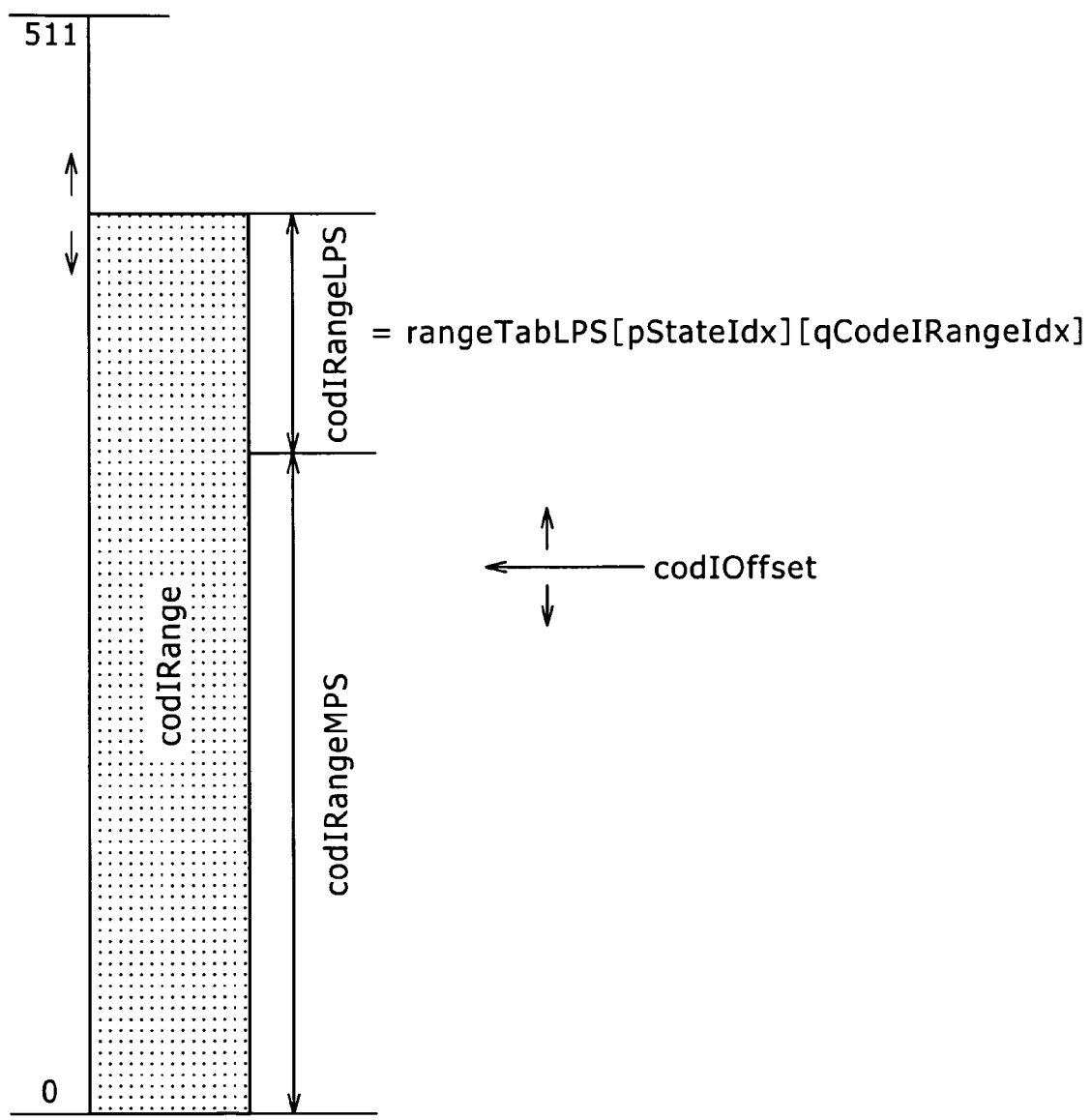
FIG. 26 illustrates a concept of a decoding process in CABAC.
Figure 29:
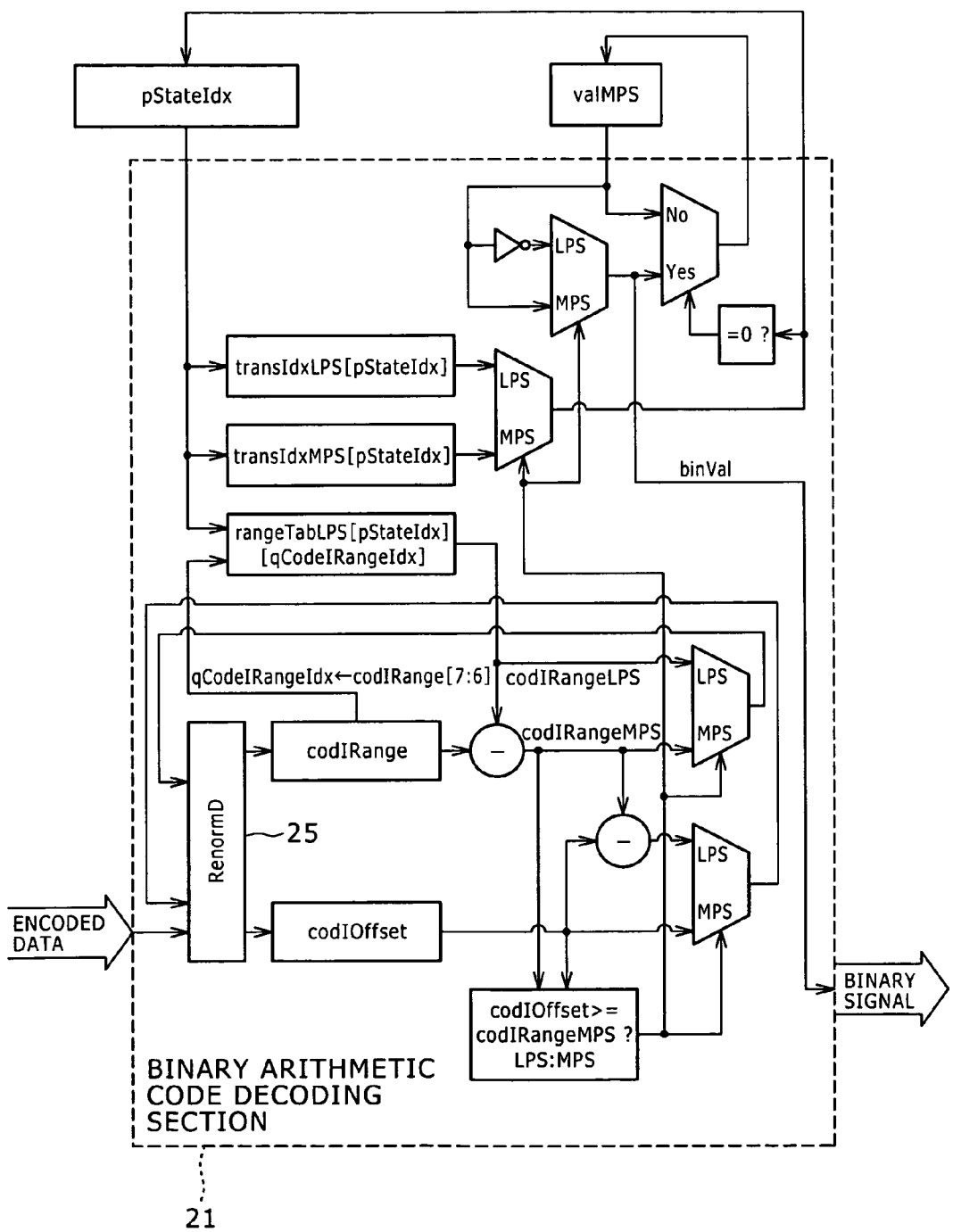
FIG. 29 illustrates an exemplary structure of a known binary arithmetic code decoding section 21 in the CABAC.
Figure 30:
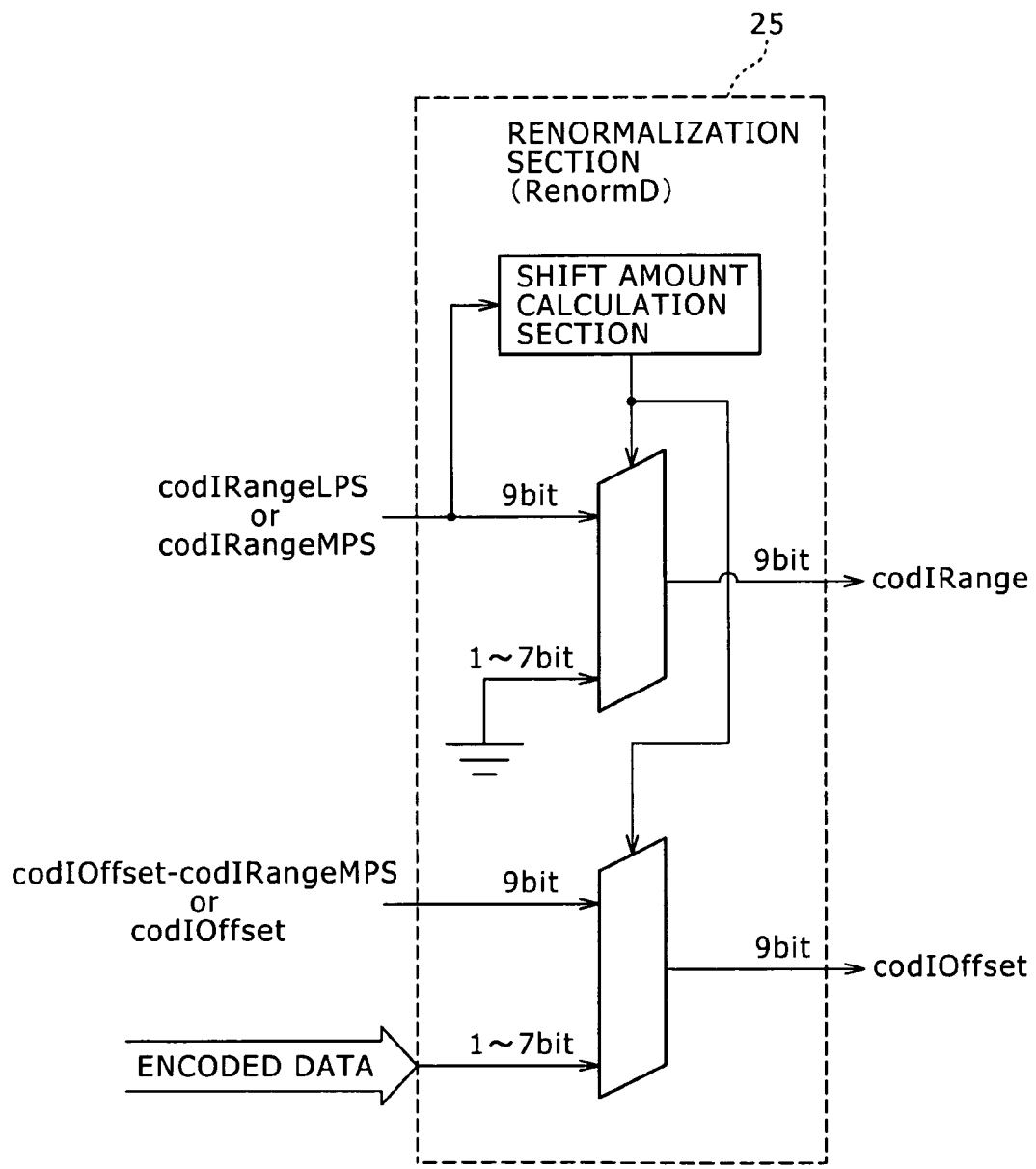
FIG. 30 illustrates an exemplary structure of a known renormalization section 25 in the CABAC.

FIG. 23 illustrates an exemplary structure of the context variable update value collective calculation section 190 according to this embodiment of the present invention. The context variable update value collective calculation section 190 includes: symbol state determination sections 711, 712, 713, and 714; pStateIdx conversion sections 721, 722, 723, and 724; pStateIdx conversion sections 731, 732, 733, and 734; and selectors 741, 742, 743, 744, 751, 752, 753, and 754.

If the LPS has been decoded when pStateIdx=0, when the estimated value of the probability of the occurrence of the LPS is the greatest, the symbol state determination sections 711 to 714 determine that the symbol of the LPS has become the most probable, and generate a control signal for inverting valMPS.

The pStateIdx conversion sections 721 to 724 convert pStateIdx so as to satisfy the transition table transIdxLPS as illustrated in FIG. 28. The pStateIdx conversion sections 731 to 734 convert pStateIdx so as to satisfy the transition table transIdxMPS as illustrated in FIG. 28.

The selectors 741 to 744 select an update value of pStateIdx. Specifically, the selector 741 selects, as an update value of pStateIdx[0], an output from the pStateIdx conversion section 721 if L is "0" and is LPS is "Yes," and an output from the pStateIdx conversion section 731 if L is not "0" or is LPS is not "Yes." The selector 742 selects, as an update value of pStateIdx[1], an output from the pStateIdx conversion section 722 if L is "1" and is LPS is "Yes," and an output from the pStateIdx conversion section 732 if L is not "1" or is LPS is not "Yes." The selector 743 selects, as an update value of pStateIdx[2], an output from the pStateIdx conversion section 723 if L is "2" and is LPS is "Yes," and an output from the pStateIdx conversion section 733 if L is not "2" or is LPS is not "Yes." The selector 744 selects, as an update value of pStateIdx345, an output from the pStateIdx conversion section 724 if L is "3" and is LPS is "Yes," and an output from the pStateIdx conversion section 734 if L is not "3" or is LPS is not "Yes."

The selectors 751 to 754 select an update value of valMPS. Specifically, the selector 751 selects, as an update value of valMPS[0], the inverse value of valMPS[0] if a result of the determination by the symbol state determination section 711 is "Yes," and the value of valMPS[0] if the result of the determination by the symbol state determination section 711 is "No." The selector 752 selects, as an update value of valMPS[1], the inverse value of valMPS[1] if a result of the determination by the symbol state determination section 712 is "Yes," and the value of valMPS[1] if the result of the determination by the symbol state determination section 712 is "No." The selector 753 selects, as an update value of valMPS[2], the inverse value of valMPS[2] if a result of the determination by the symbol state determination section 713 is "Yes," and the value of valMPS[2] if the result of the determination by the symbol state determination section 713 is "No." The selector 754 selects, as an update value of valMPS345, the inverse value of valMPS[0] if a result of the determination by the symbol state determination section 714 is "Yes," and the value of valMPS[0] if the result of the determination by the symbol state determination section 714 is "No."

Here, in the case where each context index is different from the other, the context variable identified by ctxIdx[i] (i=0, 1, and 2) corresponds to pStateIdx[i] and valMPS[i] (i=0, 1, and 2), and Out_pStateIdx[i] and Out_valMPS[i] (i=0, . . . , L) are used as update values of the context variable identified by ctxIdx[i] (i=0, . . . , L). Note, however, that Out_pStateIdx[i] and Out_valMPS[i] when i>L are not used as the update values, and that the context variable identified by ctxIdx[i] (i>L) is not updated.

Meanwhile, in the case where each context index is identical, only the context variable identified by ctxIdx[0] is used, and the context variable is set so as to have pStateIdx[0] and valMPS[0]. Here, pStateIdx[0] involves different times of transitions depending on the number of MPSs that have been decoded collectively, and therefore, each of the pStateIdx conversion sections 141 to 143 calculates its corresponding value, and based on pState345 selected by the pStateIdx selector 150, the update value is obtained. Only Out_p-

StateIdx345 and Out_valMPS345 are used as the update values of the context variable identified by ctxIdx[0].

As described above, according to this embodiment of the present invention, the provision of the subsequent symbol decoding information table 114 makes it possible to obtain codIRangeMPS, codIRangeLPS, and sftL, which represents the symbol length that does not involve the occurrence of a shift, by table reference, based on codIRange and pStateIdx which are used when decoding the top symbol. Moreover, the table reference is not performed for all symbols, but codIRangeMPS and codIRangeLPS for the first symbols are obtained by the symbol decoding information calculation sections 111 to 113, which are cascaded with one another, while codIRangeMPS and codIRangeLPS for only the subsequent symbols are obtained by the table reference. Thus, the subsequent symbol decoding information table 114 needs to have only a limited capacity.

Here, consideration will be given to a hardware scale of the subsequent symbol decoding information table 114. The number of bits required is 3 bits for sftL, 9 bits for codIRangeMPS[i] (because the range is from 0x000 to 0x1FF), and 8 bits for codIRangeLPS[i] (because the range is from 0x100 to 0x1FF). In addition, pStateIdx has 64 possible cases and codIRange has 256 possible cases, and therefore, there are 16384 possible cases in total.

In the case where all six symbols are listed in the table, instead of only the subsequent symbols as in FIG. 15, the capacity required would be $(3+(9+8)\times 6)\times 16384=210$ KB (kilobytes).

Note, however, that information about maxL is not necessary, with respect to those where sftL is less than maxL. For example, information about a tuple where sftL is "1" has only $3+9+8=20$ bits of effective data. FIG. 24 illustrates a result of calculation of the number of symbols that can be decoded until a shift is required in the renormalization process with the condition that the MPS is always decoded on the assumption of codIOffset=0. Specifically, FIG. 24 illustrates a table that shows proportions with tuples of the table being classified according to sftL, when considering the case where the length sftL permitting collective decoding, codIRangeMPS[i], and codIRangeLPS[i] (i=0, . . . , sftL) are listed in the table, with respect to all 16384 (2 to the power of 14) possible cases, when codIRange is set to all values from 0x100 to 0x1FF and pStateIdx are set to all values from 0 to 63, with the condition codIOffset=0, where the MPS is always decoded.

The amount of effective data as calculated based on the above is $3\times 16384+(9+8)\times(3429+2757\times 2+1611\times 3+1174\times 4+846\times 5+6567\times 6)$=approximately 135 KB, which amounts to approximately 65% of the whole. In general, the hardware scale can be reduced by generating the table with logic circuits, while assigning an arbitrary value to ineffective data. In actuality, in this embodiment, the same value often appears in succession among different tuples, and therefore, the hardware scale can be reduced by efficient logic minimization.

It is apparent from FIG. 24 that lengths permitting collective decoding of 1, 2, and 3 symbols correspond to approximately a half (47.6%) of the total number of tuples. Accordingly, consideration is given to further reduction in the hardware scale by listing only the subsequent symbols in the table. In the case where all six symbols, without the use of the table, are to be obtained by the computing units that are cascaded with one another, a calculation for one symbol is dependent on a calculation for another, and therefore, a significant delay is required to complete the calculation in a single cycle, and a maximum operating frequency is reduced too greatly. In the case where, as illustrated in FIG. 15, the top three symbols are calculated using the cascade structure, and the remaining three symbols are calculated by the table reference, the amount of the effective data that is required in the table is only $3\times 16384+(9+8)\times(1174+846\times 2+6567\times 3)$=approximately 53 KB, which amounts to approximately 25% of that in the case where all the six symbols are listed in the table.

In this embodiment of the present invention, the collective decoding process for multiple symbols is performed only when there is no need for the renormalization process, i.e., when there is no need for a left shift, and therefore, the renormalization process occurs only once, the number of shifts is one in the case of the MPS, the number of shifts is from 1 to 7 in the case of the LPS, and only a maximum of 7 bits of encoded data need be inputted. Therefore, the circuit for the input of the encoded data needs to support the shift by only up to 7 bits. In a known circuit that always decodes two symbols regardless of whether they are the MPS or the LPS, a circuit for the input of the encoded data needs to support the shift by up to 14 bits. This also shows that this embodiment of the present invention can be implemented with uncomplicated, small-scaled circuitry.

Note that a reason why, in this embodiment of the present invention, the collective decoding of multiple symbols is performed only when continuous MPSs occur is as follows. That is, the fact that it is possible to decode a plurality of MPSs without a shift means that a plurality of MPSs are compressed into a 1-bit code; hence a code of 1 bit or less. In actuality, in the case where pStateIdx is "62" or less, a maximum of 35 symbols can be compressed into one bit. On the other hand, the case of the LPS necessarily involves a left shift by 1 to 7 bits; hence a code of 1 or more bits. As described above, in the CABAC, if the encoding is performed such that MPSs are arranged continuously in a stream, more information can be compressed into the stream of the same bit rate. This kind of stream involves an increased number of symbols to be CABAC decoded, and in the case of an encoding device that is capable of decoding only one symbol at a time, the number of processing cycles increases in proportion to the number of symbols.

In particular, in the case where there is a bit rate constraint, a reduced number of processing cycles per code bit will reduce variation in the number of processing cycles, resulting in smoothing. This also smoothes variation in speed at which the codes are processed, which will eliminate the need to request a transfer of a large amount of data for a moment for code acquisition, resulting in achievement of a more efficient decoding process.

FIG. 25 is a table showing proportions where the number of possibilities is classified according to the length L permitting collective decoding. With respect to all 8,388,608 (2 to the power of 23) possibilities that may occur in actual decoding, where the MPSs may not follow each other because of the decoding of the LPS, the L permitting collective decoding is calculated while all values from 0x000 to 0x1FF are assigned to codIOffset.

FIG. 25 shows that lengths permitting collective decoding of 1 to 6 occupy 76.7%, which amounts to more than three quarters of the whole. Thus, if about six symbols can be processed at a time as in this embodiment of the present invention, about three quarters of all the cases require only one processing cycle, while the rest of the cases, i.e., about a quarter of all the cases, require a few processing cycles. Even in the case where one bit contains 35 encoded symbols, only six processing cycles are required. This shows that a sufficient effect of smoothing can be expected.

Note that the foregoing description of this embodiment of the present invention is in all aspects illustrative and not restrictive. Components of this embodiment of the present invention correspond to features as recited in the appended claims as described below.

Regarding claim 1, a decoding information table corresponds to the subsequent symbol decoding information table 114, for example. A number-of-symbols determination section corresponds to the LPS search section 120, for example. An output section corresponds to the binary data collective conversion section 180, for example.

Regarding claim 2, a decoding information generation section corresponds to the symbol decoding information calculation sections 111 to 113, for example.

Regarding claim 3, a context variable table corresponds to the context variable table storage section 23, for example. A decoding control section corresponds to the decoding control circuit 200, for example.

Note that the above-described procedures in the embodiment of the present invention described above may be viewed as a method having corresponding series of steps, and also may be viewed as a program for causing a computer to execute the series of steps or as a storage medium that stores the program.

It should be understood by those skilled in the art that various modifications, combinations, sub-combinations and alterations may occur depending on design requirements and other factors insofar as they are within the scope of the appended claims or the equivalents thereof.

What is claimed is:

1. An arithmetic decoding apparatus that decodes encoded data while updating a first state variable and a second state variable based on a first context variable and a second context variable, the first state variable being a basis for the decoding, the second state variable being an object to be decoded, the first context variable representing a probability state, the second context variable representing a most probable symbol, the arithmetic decoding apparatus comprising:

a decoding information table that stores transitions of a range of the most probable symbol and a range of a least probable symbol within a range identified by the first context variable, and a number of a symbol for which the range of the most probable symbol becomes less than a specific value, the decoding information table being referred to based on the first state variable and the first context variable;

number-of-symbols determination means for determining the number of symbols in the encoded data that are to be decoded collectively, based on the transitions of the range of the most probable symbol and the range of the least probable symbol, the number of the symbol for which the range of the most probable symbol becomes less than the specific value, and the second state variable; and output means for decoding a symbol corresponding to the number of symbols that are to be decoded collectively, based on the second context variable, and outputting the decoded symbol.

2. The arithmetic decoding apparatus according to claim 1, further comprising decoding information generation means for sequentially generating the range of the most probable symbol and the range of the least probable symbol for a group of continuous symbols that have the same most probable symbol, wherein the decoding information table stores only information that is required to decode a symbol or symbols that follow the group of symbols.

3. The arithmetic decoding apparatus according to claim 2, further comprising:

a context variable table that stores the first context variable for each of context indexes; and decoding control means for, in the case where each of the group of symbols has a different context index, acquiring, from the context variable table, the first context variable for each of the group of symbols independently based on the respective context indexes, and, in the case where each of the group of symbols has an identical context index, acquiring the first context variable for each of the group of symbols by retrieving a top one of the first context variables from the context variable table and allowing the first context variable to transition based on the top one of the first context variables to acquire the subsequent first context variables.

* * * * *